(12) United States Patent
Park et al.

(10) Patent No.: US 9,042,194 B2
(45) Date of Patent: May 26, 2015

(54) REFRESH METHOD, REFRESH ADDRESS GENERATOR, VOLATILE MEMORY DEVICE INCLUDING THE SAME

(71) Applicant: Samsung Electronics Co., Ltd., Suwon-si (KR)

(72) Inventors: Chul-Woo Park, Yongin-si (KR); Joo-Sun Choi, Hwaseong-si (KR); Hong-Sun Hwang, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/057,556

(22) Filed: Oct. 18, 2013

(65) Prior Publication Data

US 2014/0112086 A1 Apr. 24, 2014

(30) Foreign Application Priority Data

Oct. 19, 2012 (KR) .................. 10-2012-0116356

(51) Int. Cl.
| | |
|---|---|
| G11C 11/402 | (2006.01) |
| G11C 11/406 | (2006.01) |
| G11C 11/408 | (2006.01) |
| G11C 8/08 | (2006.01) |
| G11C 29/02 | (2006.01) |

(52) U.S. Cl.
CPC ........ *G11C 11/40618* (2013.01); *G11C 29/028* (2013.01); *G11C 11/406* (2013.01); *G11C 29/023* (2013.01); *G11C 11/408* (2013.01); *G11C 11/40611* (2013.01); *G11C 2211/4065* (2013.01)

(58) Field of Classification Search
CPC ........... G11C 11/406; G11C 11/40618; G11C 2211/4065; G11C 29/028; G11C 29/023; G11C 11/408

USPC ......................................... 365/222, 236, 239
See application file for complete search history.

(56) References Cited

U.S. PATENT DOCUMENTS

| | | | |
|---|---|---|---|
| 6,134,167 A * | 10/2000 | Atkinson | 365/222 |
| 7,095,669 B2 | 8/2006 | Oh | |
| 7,551,505 B1 | 6/2009 | Daniel | |
| 2001/0009022 A1 | 7/2001 | Feierbach | |
| 2006/0250873 A1 | 11/2006 | Hosokawa et al. | |
| 2009/0161466 A1 | 6/2009 | Hamilton et al. | |
| 2011/0069572 A1* | 3/2011 | Lee et al. | 365/222 |
| 2011/0255357 A1* | 10/2011 | Pelley et al. | 365/201 |
| 2012/0300568 A1* | 11/2012 | Park et al. | 365/222 |
| 2013/0272082 A1* | 10/2013 | Kim et al. | 365/203 |
| 2013/0282973 A1* | 10/2013 | Kim et al. | 711/106 |

* cited by examiner

*Primary Examiner* — Ly D Pham
(74) *Attorney, Agent, or Firm* — Muir Patent Law, PLLC

(57) ABSTRACT

A refresh method for a volatile memory device includes refreshing memory cells of a first set of rows of an array at a first refresh rate having a first refresh period, the first refresh rate being a lower rate having a longer refresh period than a second refresh rate having a second refresh period, wherein each memory cell in the first set of rows of the array has a retention time longer than the first refresh period; and refreshing memory cells of a second set of rows of the array at a third refresh rate having a third refresh period, the third refresh rate being a higher rate having a shorter refresh period than the second refresh rate having the second refresh period, wherein at least one memory cell of each row of the second set of rows has a retention time longer than the third refresh period and shorter than the first refresh period. The second refresh period corresponds to a refresh period defined in a standard for the volatile memory device.

18 Claims, 17 Drawing Sheets

REFRESH METHOD, REFRESH ADDRESS GENERATOR, VOLATILE MEMORY DEVICE INCLUDING THE SAME

CROSS-REFERENCE TO RELATED APPLICATIONS

This U.S. non-provisional application claims the benefit of priority under 35 U.S.C. §119 to Korean Patent Application No. 10-2012-0116356 filed on Oct. 19, 2012 in the Korean Intellectual Property Office (KIPO), the entire content of which is incorporated herein by reference in its entirety.

BACKGROUND

This disclosure relates to volatile memory devices. More particularly, example embodiments relate to methods of refreshing volatile memory devices, refresh address generators, and volatile memory devices.

A volatile memory device, such as a dynamic random access memory (DRAM), performs a refresh operation to retain data stored in memory cells. If a memory cell has a retention time shorter than a refresh period defined in a standard (e.g., the DDR3 SDRAM standard, the DDR4 SDRAM standard, etc.) of the volatile memory device, a row of memory cells with such a memory cell is typically replaced with a row of redundancy cells.

As the size of the memory cell shrinks, the number of memory cells having retention times shorter than the refresh period increases. Accordingly, the number of rows of redundancy cells should be increased in a conventional volatile memory device. However, such a high number of redundancy cells increases the size and complexity of the volatile memory device.

SUMMARY

Some example embodiments provide a refresh address generator for adaptively performing a refresh operation according to a data retention characteristic of each memory cell while maintaining a refresh time interval defined in a standard of a volatile memory device.

Some example embodiments provide a volatile memory device that adaptively performs a refresh operation according to a data retention characteristic of each memory cell while maintaining a refresh time interval defined in a standard of a volatile memory device.

Some example embodiments provide a refresh method for a volatile memory device that performs one or more refresh operations based on data retention characteristics of memory cells.

In one embodiment, a refresh method is disclosed for a volatile memory device including a plurality of memory cells arranged in an array having a plurality of rows and a plurality of columns, each row corresponding to a respective address. The refresh method includes: refreshing memory cells of a first set of rows of the array at a first refresh rate having a first refresh period, the first refresh rate being a lower rate having a longer refresh period than a second refresh rate having a second refresh period, wherein each memory cell in the first set of rows of the array has a retention time longer than the first refresh period; and refreshing memory cells of a second set of rows of the array at a third refresh rate having a third refresh period, the third refresh rate being a higher rate having a shorter refresh period than the second refresh rate having the second refresh period, wherein at least one memory cell of each row of the second set of rows has a retention time longer than the third refresh period and shorter than the first refresh period. The second refresh period may correspond to a refresh period defined in a standard for the volatile memory device.

In another embodiment, a refresh method is disclosed for a volatile memory device including a plurality of memory cells arranged in an array having a plurality of rows and a plurality of columns, each row corresponding to a respective address. The refresh method includes: refreshing memory cells of a first set of rows of the array at a first refresh rate having a first refresh period, based on a counter-based refresh, wherein the memory cells of the first set of rows have a retention time longer than the first refresh period; and refreshing memory cells of a second set of rows of the array at a second refresh rate having a second refresh period, based on a table-based refresh, the second refresh rate being a higher rate having a shorter refresh period than the first refresh period, wherein at least one memory cell of each row of the second set of rows has a retention time longer than the second refresh period and shorter than the first refresh period.

In a further embodiment, a method of performing a refresh operation in a memory device including a memory array having rows and columns is disclosed. The method includes: performing a first refresh sub-operation by cycling through all of the rows of the memory array consecutively at equally spaced first time intervals based on a counter, such that each row of the first refresh sub-operation is refreshed subsequent to an adjacent previously refreshed row of the first refresh sub-operation after an occurrence of the first time interval, wherein the time between two refreshes of the same row in the first refresh sub-operation is referred to as a refresh cycle; and performing a second refresh sub-operation within the refresh cycle on a plurality of first rows of the memory array based on information stored in a table, and not performing the second refresh sub-operation within the refresh cycle on a plurality of second rows of the memory array. The plurality of first rows may each include at least one cell that has a first retention time, and the plurality of second rows may include a plurality of cells that have retention times longer than the first retention time.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
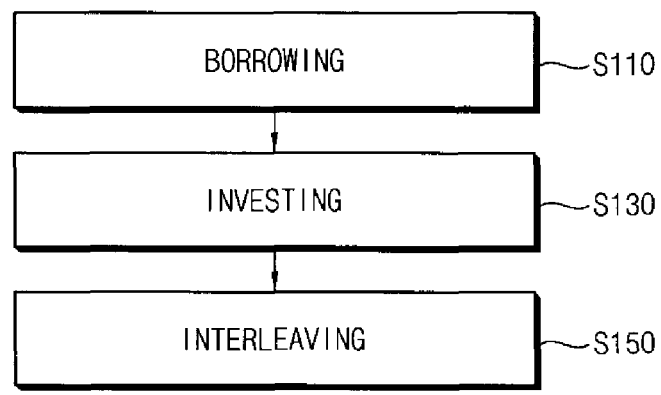
FIG. 1 is a flow chart illustrating generalized refresh leveraging according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
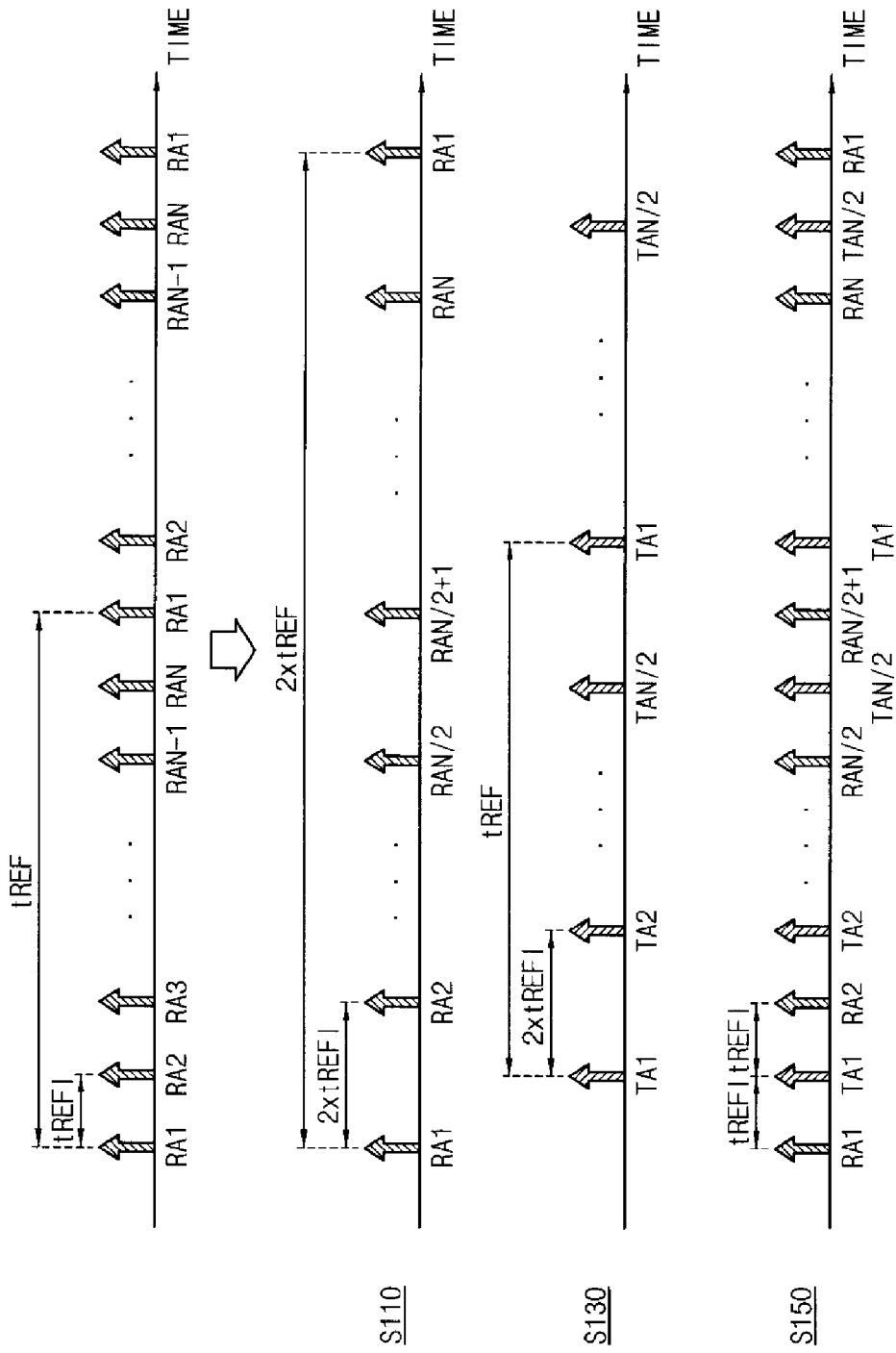
FIG. 2 is a diagram illustrating a refresh operation of generalized refresh leveraging according to example embodiments.
Figure 3:
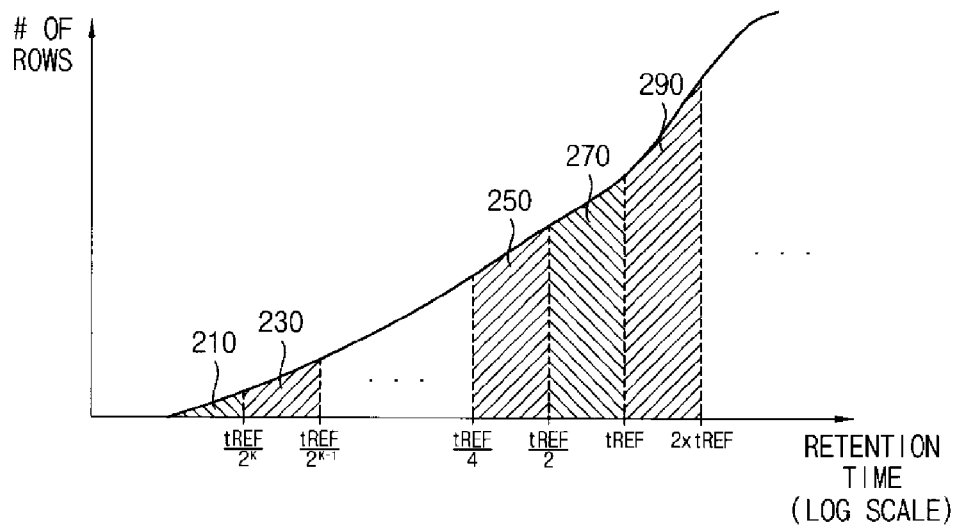
FIG. 3 is a diagram illustrating an exemplary distribution of memory cell rows according to a retention time.

FIG. 1 is a flow chart illustrating generalized refresh leveraging according to example embodiments, FIG. 2 is a diagram illustrating a refresh operation of generalized refresh leveraging according to example embodiments, and FIG. 3 is a diagram illustrating a distribution of memory cell rows according to a retention time.

Referring to FIGS. 1 and 2, in one exemplary embodiment of a method of refreshing a volatile memory device, a refresh period of a counter-based refresh is increased (S110). For example, the counter-based refresh may be performed by using a refresh address counting unit that sequentially outputs row addresses of all memory cell rows. In one embodiment, for each cycle of the counter-based refresh, the counting unit sequentially outputs all addresses for a set of row addresses, in order to refresh all of the memory cells in that set of rows. In one embodiment, a memory cell row is a row of memory cells coupled to the same word line. In some example embodiments, the refresh period of the counter-based refresh may be increased to be greater than a refresh period defined in a standard for the volatile memory device. For example, the refresh period for the counter-based refresh may be any multiple of a refresh period tREF defined in a standard of the volatile memory device. As described above, a standard may refer to the DDR3 SDRAM standard, the DDR4 SDRAM standard, or other nonvolatile memory standards typically used by groups of manufacturers to conform their products to the industry norm.

In some example embodiments, as illustrated in FIG. 2, the refresh period of the counter-based refresh may be increased to double the refresh period tREF defined in the standard of the volatile memory device. For example, a conventional refresh address counting unit having M counters may sequentially output N refresh addresses RA1, RA2, RA3, RAN−1 and RAN with a refresh time interval tREFI defined in the standard of the volatile memory device, where M is an integer greater than 0, and N is 2^M. The refresh address counting unit according to example embodiments may further include an LSB−1 counter lower by one bit than an LSB counter of the conventional refresh address counting unit in addition to the M counters of the conventional refresh address counting unit. Thus, the refresh address counting unit according to example embodiments may sequentially output the N refresh addresses RA1, RA2, RA3, RAN−1 and RAN with an interval 2*tREFI corresponding to double the refresh time interval tREFI defined in the standard of the volatile memory device. Accordingly, in some example embodiments, the counter-based refresh for one memory cell row may be performed once per a period 2*tREF corresponding to double the refresh period tREF defined in the standard of the volatile memory device.

If the refresh period or the refresh time interval of the counter-based refresh that sequentially performs refresh operations for the entire set of memory cell rows is increased, at least a portion of the refresh operations or refresh cycles may not be performed per the refresh period tREF defined in the standard of the volatile memory device. Thus the non-performed refresh operations or refresh cycles may be provided to memory cell rows having relatively short retention times among the entire memory cell rows. Accordingly, the increase of the refresh period or the refresh time interval of the counter-based refresh may be referred to as "Borrowing" the refresh operations or the refresh cycles from the entire memory cell rows.

In the method of refreshing the volatile memory device, a table-based refresh may be performed (S130). The table-based refresh may be performed using a refresh address table that stores a row address of a memory cell having a retention time shorter than a predetermined time. A row address of one memory cell row having a short retention time may be stored in one or more lines of the refresh address table according to the retention time of the memory cell row, and the table-based refresh for the memory cell row may be performed a predetermined number of times corresponding to the number of lines where the row address of the memory cell row is stored.

In some example embodiments, referring to FIG. 3, each of row addresses of memory cell rows 290 having retention times longer than or equal to tREF and shorter than 2*tREF may be stored in one line of the refresh address table, and the table-based refresh for each of the memory cell rows 290 may be performed once per tREF, where tREF is the refresh period defined in the standard of the volatile memory device. For example, tREF may be the period corresponding to an entire cycle of rows in an array being refreshed during a refresh operation in the array. Each of row addresses of memory cell rows 270 having retention times longer than or equal to tREF/2 and shorter than tREF may be stored in two lines of the refresh address table, and the table-based refresh for each of the memory cell rows 270 may be performed twice per tREF. Each of row addresses of memory cell rows 250 having retention times longer than or equal to tREF/4 and shorter than tREF/2 may be stored in four lines of the refresh address table, and the table-based refresh for each of the memory cell rows 250 may be performed four times per tREF. Each of row addresses of memory cell rows 230 having retention times longer than or equal to tREF/2^K and shorter than tREF/2^(K−1) may be stored in 2^K lines of the refresh address table, and the table-based refresh for each of the memory cell rows 230 may be performed 2^K times per tREF, where K is an integer greater than 1. Memory cell rows having retention times longer than or equal to 2*tREF may retain data even if the table-based refresh for the memory cell rows is not performed, and thus row addresses of the memory cell rows having the retention times longer than or equal to 2*tREF may not be stored in the refresh address table. For these rows, in one embodiment, only counter-based refresh is performed. In some example embodiments, memory cell rows 210 having retention times shorter than tREF/2^K may be replaced with redundancy cell rows.

In other example embodiments, each of the row addresses of memory cell rows having retention times longer than or equal to tREF/I and shorter than tREF/(I−1) may be stored in I evenly spaced lines of the refresh address table, and the table-based refresh for each of the memory cell rows may be performed I times per tREF, where I is an integer greater than 1. For example, a row address of a memory cell row having a retention time longer than or equal to tREF/3 and shorter than tREF/2 may be stored in three evenly spaced lines of the refresh address table, and the table-based refresh for the memory cell row may be performed three times per tREF.

The refresh address table may include any number of lines. In some example embodiments, if the refresh address counting unit outputs the N refresh addresses RA1, RA2, RA3, RAN−1 and RAN, the refresh address table may have N/2 lines in which N/2 refresh addresses TA1, TA2 and TAN/2 are respectively stored. In this case, the refresh address table may output the N/2 refresh addresses TA1, TA2 and TAN/2 with an interval 2*tREFI corresponding to double the refresh time interval tREFI defined in the standard of the volatile memory device, and the table-based refresh for each memory cell row having a row address stored in the refresh address table may be performed with the refresh period tREF defined in the standard of the volatile memory device.

Performing the table-based refresh for memory cell rows having short retention times may be referred to as "Investing" the refresh operations or the refresh cycles that are borrowed from the entire memory cell rows.

In the method of refreshing the volatile memory device, the counter-based refresh and the table-based refresh may be alternately performed (S150). For example, as illustrated in FIG. 2, the table-based refreshes using the refresh addresses TA1, TA2 and TAN/2 from the refresh address table may be inserted between the counter-based refreshes using the refresh addresses RA1, RA2, RAN/2, RAN/2+1 and RAN from the refresh address counting unit. Thus, the counter-based refreshes and the table-based refreshes may be alternately performed with the refresh time interval tREFI defined in the standard of the volatile memory device. As described above, in the method of refreshing the volatile memory device according to example embodiments, since the refresh time interval tREFI defined in the standard of the volatile memory device is maintained, a refresh operation is adaptively performed according to data retention characteristics, or retention times of respective memory cells without increasing refresh current or power consumption.

Performing alternately the counter-based refresh and the table-based refresh may be referred to as "Interleaving" the counter-based refresh and the table-based refresh.

As described above, in the method of refreshing the volatile memory device according to example embodiments, the refresh period of the counter-based refresh for the entire memory cell rows may be increased (i.e., Borrowing), the table-based refresh for the memory cell row having the retention time shorter than the predetermined time may be performed (i.e., Investing), and the counter-based refresh and the table-based refresh may be alternately performed (i.e., Interleaving). Accordingly, a refresh operation may be adaptively performed according to data retention characteristics, or retention times of respective memory cells while maintaining the refresh time interval defined in the standard of the volatile memory device.

The method including borrowing the refresh operations or the refresh cycles from the entire memory cell rows, investing the refresh operations or the refresh cycles in memory cell rows having short retention times and interleaving the counter-based refresh for the entire memory cell rows and the table-based refresh for memory cell rows having short retention times may be referred to as "Generalized Refresh Leveraging."

By generalized refresh leveraging according to example embodiments, refresh operations for the memory cell rows having short retention times may be performed with a period shorter than the refresh period tREF defined in the standard of the volatile memory device without increasing the refresh current (e.g., an auto refresh current (IDD5) or a self refresh current (IDD6)) and without increasing refresh power consumption. Further, the memory cell rows having short retention times do not need to be replaced with redundancy cell rows, and thus a size of a redundancy cell array and/or a redundancy circuit may be reduced.

Although FIG. 2 illustrates an example where the refresh period of the counter-based refresh is increased to double the refresh period tREF defined in the standard of the volatile memory device, in some example embodiments, the refresh period of the counter-based refresh may be increased to an integer multiple of the refresh period tREF or to a real number multiple of the refresh period tREF. For example, if the refresh period of the counter-based refresh is increased to four times the refresh period tREF defined in the standard of the volatile memory device, the table-based refresh may be performed three times each time the counter-based refresh is performed once. In other examples, if the refresh period of the counter-based refresh is increased to four thirds of the refresh period tREF defined in the standard of the volatile memory device, the table-based refresh may be performed once each time the counter-based refresh is performed three times.

Although FIG. 2 illustrates an example where the refresh address table has N/2 lines, and outputs N/2 refresh addresses TA1, TA2 and TAN/2 with a period of tREF, in some example embodiments, the refresh address table may have any number of lines. For example, in a case where the refresh address counting unit outputs N refresh addresses RA1, RA2, RA3, RAN−1 and RAN, the refresh address table may have N/4 lines, and thus may output N/4 refresh addresses with a period of tREF/2. In other examples, in the case where the refresh address counting unit outputs N refresh addresses RA1, RA2, RA3, RAN−1 and RAN, the refresh address table may have N lines, and thus may output N refresh addresses with a period of 2*tREF.

Figure 4:
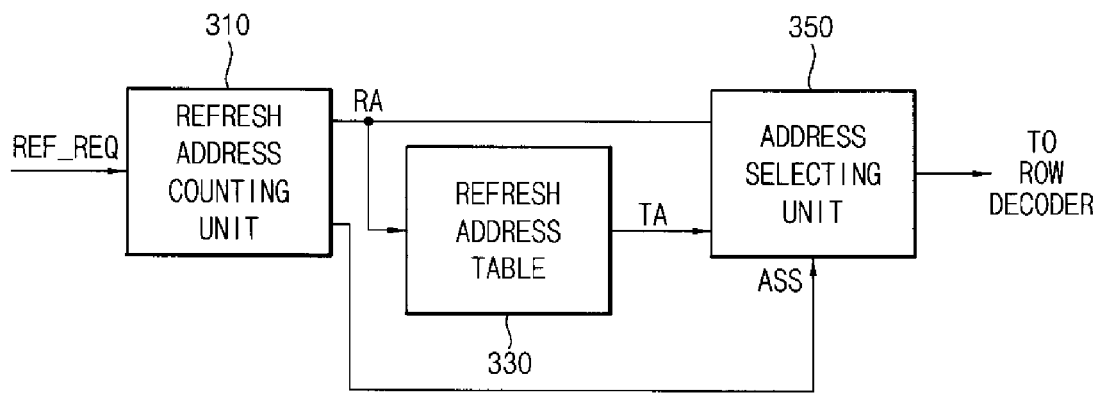
FIG. 4 is a block diagram illustrating a refresh address generator according to example embodiments.

FIG. 4 is a block diagram illustrating a refresh address generator according to example embodiments.

Referring to FIG. 4, a refresh address generator 300 includes a refresh address counting unit 310, a refresh address table 330 and an address selecting unit 350.

The refresh address counting unit 310 may include a circuit (e.g. a refresh address counting circuit) configured to generate a counting signal by performing a counting operation in response to a refresh request signal REF_REQ. In some example embodiments, the refresh request signal REF_REQ may be generated in response to a refresh command that is periodically received from a host device. In other example embodiments, the refresh request signal REF_REQ may be generated by a built-in timer included in a volatile memory device. The refresh address counting unit 310 may output at least one bit of the counting signal as an address selection signal ASS, and may output other bits of the counting signal as a first refresh address RA.

In some example embodiments, the refresh address counting unit 310 may generate the counting signal having M+1 bits, where M is an integer greater than 0. The refresh address counting unit 310 may output a least significant bit (LSB) of the counting signal as the address selection signal ASS, and may output upper M bits of the counting signal as the first refresh address RA. Since an LSB of the first refresh address RA corresponds to an LSB+1 bit of the counting signal, the first refresh address RA may be sequentially increased or decreased each time an interval corresponding to double a refresh time interval (tREFI) defined in a standard of a volatile memory device elapses, and may have a period corresponding to double a refresh period (tREF) defined in the standard of the volatile memory device. Since the address selection signal ASS corresponds to the LSB of the counting signal, the address selection signal ASS may transition from a first logic level to a second logic level or from the second logic level to the first logic level each time the refresh request signal REF_REQ is applied.

The refresh address table 330 may store a row address of a memory cell having a retention time shorter than a predetermined time. For example, the refresh address table 330 may store a row address of a memory cell having a retention time shorter than double the refresh period (tREF) defined in the standard of the volatile memory device. The row address of the memory cell may be stored in one or more lines of the refresh address table 330 according to the retention time of the memory cell.

In some example embodiments, a row address of a memory cell having a retention time longer than or equal to tREF/2^K and shorter than tREF/2^(K−1) may be stored in 2^K evenly spaced lines of the refresh address table 330, where K is an integer greater than or equal to 0. In other example embodiments, a row address of a memory cell having a retention time longer than or equal to tREF/K and shorter than tREF/(K−1) may be stored in K evenly spaced lines of the refresh address table 330.

The refresh address table 300 may receive at least some bits of the first refresh address RA as a table address, and may output, as a second refresh address TA, the row address stored in a line indicated by the table address. For example, the refresh address table 330 may receive, as the table address, lower M−1 bits of the first refresh address RA (e.g., the LSB+1 bit through MSB−1 bit of the counting signal) among the M bits of the first refresh address RA, and may output, as the second refresh address TA, the row address stored in a line indicated by the lower M−1 bits of the first refresh address RA.

In some example embodiments, the refresh address table 330 may include a table address field representing an address of each line of the refresh address table 330, and a refresh address field in which the row address (i.e., the second refresh address TA) of the memory cell having the retention time shorter than the predetermined time is stored. In some example embodiments, the second refresh address TA stored in the refresh address field may be an address that is not decoded, or may be a decoded address. The refresh address table 330 may output the second refresh address TA stored in the refresh address field in the line of which the table address field stores the table address the same as the at least some bits (e.g., lower M−1 bits) of the first refresh address RA.

In some example embodiments, in a case where the first refresh address RA provided from the refresh address counting unit 310 has M bits, and a row address of the volatile memory device has L bits, where L is an integer greater than or equal to M, the refresh address field may be from M bits to L bits. For example, if the refresh address field has M bits the same as the number of bits of the first refresh address RA, $2^{(L-M)}$ memory cell rows per memory bank may be refreshed at each refresh cycle when a counter-based refresh using the first refresh address RA is performed, and $2^{(L-M)}$ memory cell rows per memory bank may be refreshed at each refresh cycle when a table-based refresh using the second refresh address TA is performed. In other examples, if the refresh address field has L bits, $2^{(L-M)}$ memory cell rows per memory bank may be refreshed at each refresh cycle when the counter-based refresh using the first refresh address RA is performed, and one memory cell row per memory bank may be refreshed at each refresh cycle when the table-based refresh using the second refresh address TA is performed. Thus, power consumption of the volatile memory device may be reduced when the table-based refresh is performed.

In some example embodiments, the refresh address table 300 may further include a master data field representing whether the second refresh address TA is stored in each line of the refresh address table 300. In these embodiments, when the master data field of a line corresponding to at least some bits of the first refresh address RA indicates that the second refresh address TA is not stored in the line, the table-based refresh using the second refresh address TA may be skipped, or may not be performed. Accordingly, since the table-based refresh is skipped, the power consumption of the volatile memory device may be further reduced.

In some example embodiments, the volatile memory device may have one refresh address table 330. In this case, table-based refreshes for memory cell rows having the same row addresses may be substantially simultaneously performed at a plurality of memory banks of the volatile memory device. In other example embodiments, each memory bank of the volatile memory device may include at least one refresh address table 330. In this case, table-based refresh for memory cell rows having different row addresses may be performed at respective memory banks. Further, the table-based refresh may be skipped at a portion or all of memory banks according to values of the master data fields. In still other example embodiments, each memory bank of the volatile memory device may be divided into a plurality of sub-arrays, and each sub-array may include at least one refresh address table 330. In this case, each sub-array may perform the table-based refresh using the corresponding refresh address table 330. Further, the table-based refresh may be skipped at a portion or all of sub-arrays according to values of the master data fields in the refresh address tables 330 of the sub-arrays.

In some example embodiments, the refresh address table 330 may be implemented with an one-time programmable memory, such as a laser-programmable fuse memory, an anti-fuse memory, an electrically programmable fuse memory, etc., or a nonvolatile memory such as an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM).

The address selecting unit 350 may selectively output the first refresh address RA provided from the refresh address counting unit 310 or the second refresh address TA provided from the refresh address table 330 in response to the address selection signal ASS. In some example embodiments, the address selecting unit 350 may include a multiplexer that selectively outputs the first refresh address RA or the second refresh address TA in response to the address selection signal ASS.

In some example embodiments, the address selection signal ASS may transition from a first logic level to a second logic level or from the second logic level to the first logic level each time the refresh request signal REF_REQ is applied, and the address selecting unit 350 may alternately output the first refresh address RA and the second refresh address TA to a row decoder in response to the address selection signal ASS. Accordingly, the counter-based refresh using the first refresh address RA provided from the refresh address counting unit 310 and the table-based refresh using the second refresh address TA provided from the refresh address table 330 may be alternately performed.

As described above, the refresh address generator 300 according to example embodiments may alternately output the first refresh address RA and the second refresh address TA such that the counter-based refresh using the first refresh address RA and the table-based refresh using the second refresh address TA are alternately performed in the volatile memory device including the refresh address generator 300. Further, since a refresh operation including the counter-based refresh and the table-based refresh is performed while maintaining a refresh time interval (tREFI) defined in a standard of the volatile memory device, the volatile memory device including the refresh address generator 300 according to example embodiments may adaptively perform the refresh operation according to data retention characteristics of respective memory cells while complying with the refresh standard (e.g., the refresh time interval (tREFI) defined in the standard of the volatile memory device).

Figure 5:
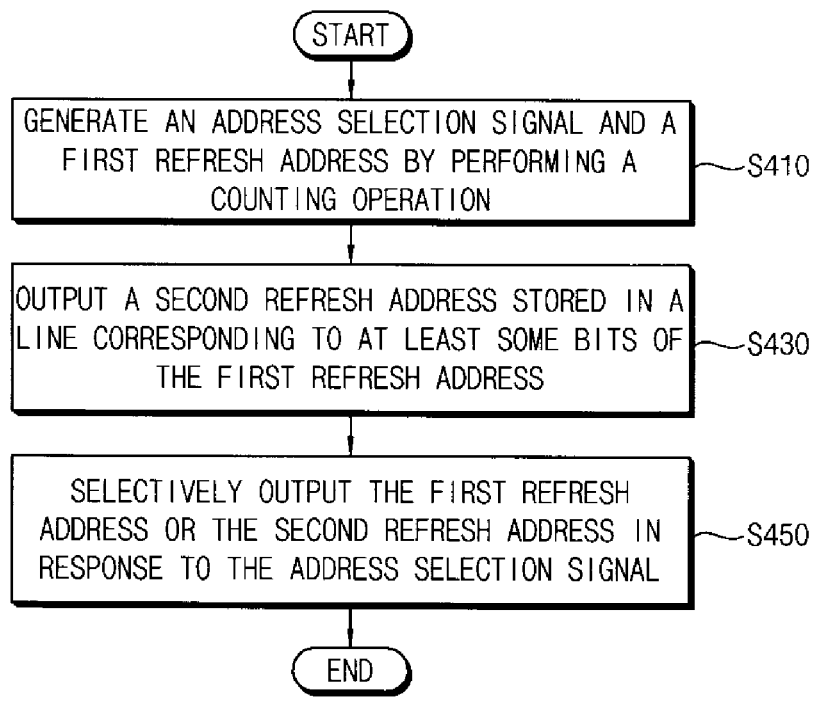
FIG. 5 is a flow chart illustrating a method of refreshing a nonvolatile memory device according to example embodiments.

FIG. 5 is a flow chart illustrating a method of refreshing a nonvolatile memory device according to example embodiments.

Referring to FIGS. 4 and 5, a refresh address counting unit 310 may generate a counting signal by performing a counting operation in response to a refresh request signal REF_REQ, may output at least one bit of the counting signal as an address selection signal ASS, and may output other bits (e.g., the remaining bits) of the counting signal as a first refresh address RA (S410).

A refresh address table 330 may store a row address of a memory cell having a retention time shorter than a predetermined time, and may output, as a second refresh address TA, the row address stored in a line corresponding to at least some bits of the first refresh address RA (S430).

The address selecting unit 350 may selectively output the first refresh address RA provided from the refresh address counting unit 310 or the second refresh address TA provided from the refresh address table 330 in response to the address selection signal ASS (S450). Accordingly, in a method of refreshing a volatile memory device including a refresh address generator 300 according to example embodiments, a counter-based refresh using the first refresh address RA provided from the refresh address counting unit 310 and a table-based refresh using the second refresh address TA provided from the refresh address table 330 may be alternately performed. Further, in the method of refreshing the volatile memory device including the refresh address generator 300 according to example embodiments, a refresh operation may be adaptively performed according to data retention characteristics of respective memory cells while maintaining a refresh time interval (tREFI) defined in a standard of the volatile memory device.

Figure 6:
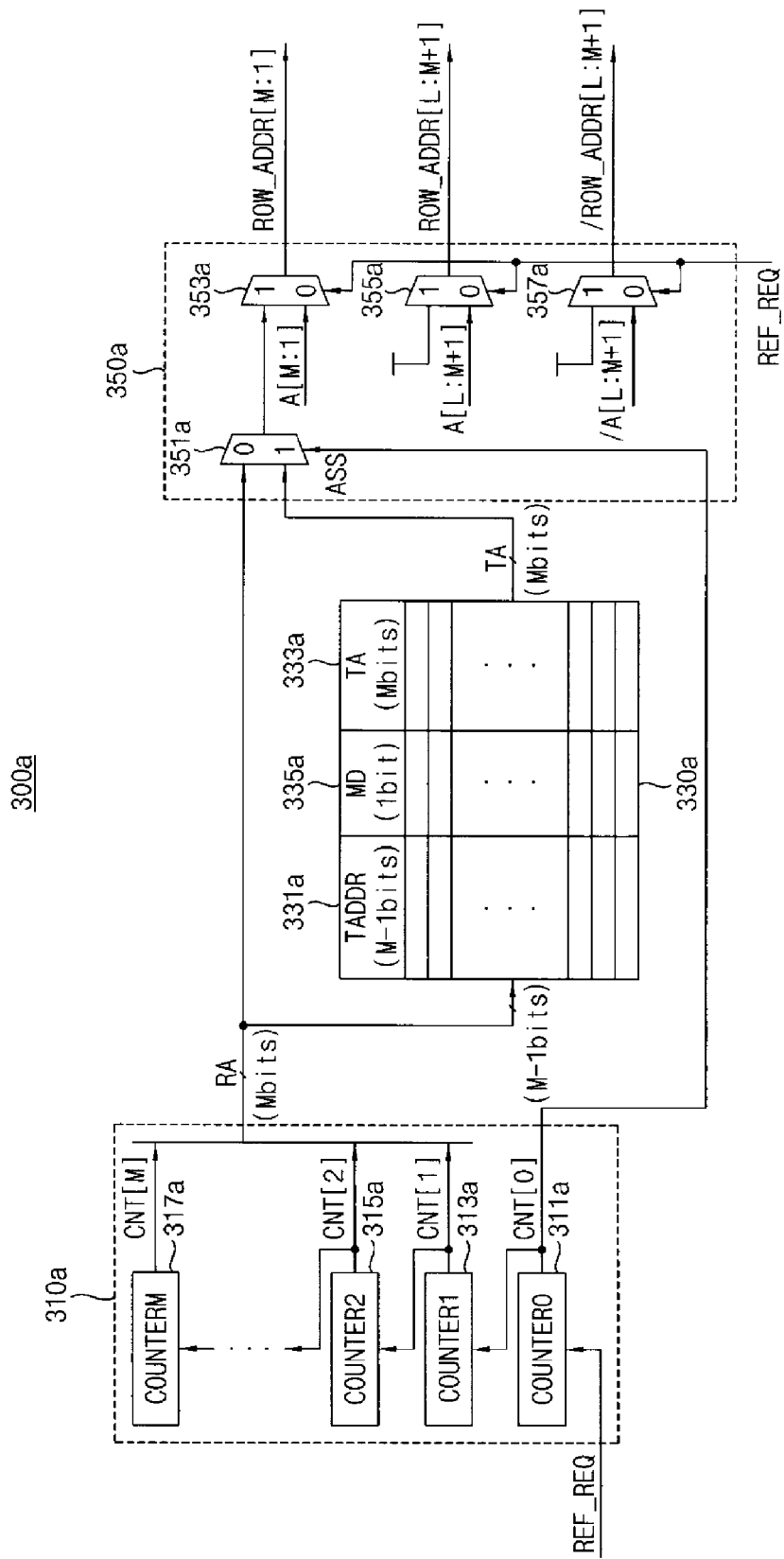
FIG. 6 is a block diagram illustrating a refresh address generator according to example embodiments.

FIG. 6 is a block diagram illustrating a refresh address generator according to example embodiments.

Referring to FIG. 6, a refresh address generator 300a includes a refresh address counting unit 310a, a refresh address table 330a and an address selecting unit 350a.

The refresh address counting unit 310a may generate a counting signal CNT[0], CNT[1], CNT[2] and CNT[M] by performing a counting operation in response to a refresh request signal REF_REQ, may output at least one bit CNT[0] of the counting signal CNT[0], CNT[1], CNT[2] and CNT[M] as an address selection signal ASS, and may output other bits CNT[1], CNT[2] and CNT[M] of the counting signal CNT[0], CNT[1], CNT[2] and CNT[M] as a first refresh address RA. In some example embodiments, compared with a conventional refresh address counting unit including M counters, the refresh address counting unit 310a may further include a counter 311a lower by one bit than an LSB counter of the conventional refresh address counting unit, or an LSB-1 counter 311a. Accordingly, a period of the first refresh address RA generated by upper M-bit counters 313a, 315a and 317a may be increased to double. For example, the refresh address counting unit 310a may include first through M+1-th counters 311a, 313a, 315a and 317a that are connected in series.

The first counter 311a may generate a first bit CNT[0] in response to the refresh request signal REF_REQ, the second counter 313a may generate a second bit CNT[1] in response to the first bit CNT[0], the third counter 315a may generate a third bit CNT[2] in response to the second bit CNT[1], and the M+1-th counter 317a may generate an M+1-th bit CNT[M] in response to an M-th bit. In some example embodiments, the first bit CNT[0] generated by the first counter 311a may be output as the address selection signal ASS, and the second through M+1-th bits CNT[1], CNT[2] and CNT[M] generated by the second through M+1-th counters 313a, 315a and 317a may be output as the first refresh address RA. In this case, the address selection signal ASS may transition from a first logic level to a second logic level or from the second logic level to the first logic level each time the refresh request signal REF_REQ is applied. Further, since the second through M+1-th bits CNT[1], CNT[2] and CNT[M] generates the first refresh address RA by counting the first bit CNT[0] having a period corresponding to double a period of the refresh request signal REF_REQ, the first refresh address RA may be sequentially increased (or decreased) each time an interval corresponding to double a refresh time interval (tREFI) defined in a standard of a volatile memory device elapses, and may have a period corresponding to double a refresh period (tREF) defined in the standard of the volatile memory device.

The refresh address table 330a may store a row address of a memory cell having a retention time shorter than a predetermined time. In some example embodiments, a row address of a memory cell having a retention time longer than or equal to $tREF/2^K$ and shorter than $tREF/2^{(K-1)}$ may be stored in $2^K$ evenly spaced lines of the refresh address table 330a, where tREF is the refresh period defined in the standard of the volatile memory device, and K is an integer greater than or equal to 0. For example, in a case where a retention time of a memory cell row (i.e., the minimum retention time among retention times of all memory cells included in the memory cell row) is longer than or equal to tREF/4 and shorter than tREF/2 (i.e., K is 2), a row address of the memory cell row may be stored in four evenly spaced lines of the refresh address table 330a. For example, the four lines may be spaced apart by a gap corresponding to a quarter of the refresh address table 330a. Accordingly, a table-based refresh for the memory cell row may be performed with a period of about tREF/4 that is shorter than or equal to the retention time of the memory cell row, and thus the memory cell row or all memory cells included in the memory cell row can retain data.

In other example embodiments, a row address of a memory cell having a retention time longer than or equal to tREF and shorter than 2*tREF may be stored in one line of the refresh address table 330a, and a row address of a memory cell row having a retention time longer than or equal to tREF/I and shorter than tREF/(I-1) may be stored in I evenly spaced lines of the refresh address table 330a, where I is an integer greater than 1. For example, a row address of a memory cell row having a retention time longer than or equal to tREF/3 and shorter than tREF/2 may be stored in three evenly spaced lines of the refresh address table 330a. For example, the three lines may be spaced apart by a gap corresponding to one third of the refresh address table 330a. Accordingly, a table-based refresh for the memory cell row may be performed with a period of about tREF/3 that is shorter than or equal to the retention time of the memory cell row, and thus the memory cell row or all memory cells included in the memory cell row can retain data.

The refresh address table 330a may include a table address field 331a representing an address (i.e., a table address TADDR) of each line of the refresh address table 330a, and a refresh address field 333a in which a second refresh address TA is stored. The refresh address table 330a may receive at least some bits of the first refresh address RA as the table address TADDR, and may compare the at least some bits of the first refresh address RA with the table address TADDR stored in the table address field 331a. In some example embodiments, the first refresh address RA may have M bits, and the table address field 331a (or the table address TADDR) may have M-1 bits, where M is an integer greater than 1. In this case, the refresh address table 330a may receive, as the table address TADDR, lower M-1 bits of the first refresh address RA (e.g., the second through M-th bits CNT[1], CNT[2] and CNT[M-1] of the counting signal). The refresh address table 330a may output the second refresh address TA stored in the refresh address field 333a in a line of which the table address field 331a stores the table address TADDR the same as the at least some bits of the first refresh address RA.

The refresh address table 330a may further include a master data field 335a representing whether the second refresh address TA is stored in each line of the refresh address table 330a. In a case where master data MD stored in the master data field 335a of a line corresponding to the at least some bits of the first refresh address RA indicate that the second refresh address TA is not stored in the line, a table-based refresh using the second refresh address TA may be skipped.

The address selecting unit 350a may selectively output the first refresh address RA provided from the refresh address counting unit 310a or the second refresh address TA provided from the refresh address table 330a in response to the address selection signal ASS. For example, the address selecting unit 350a may include a first multiplexer 351a that selectively outputs the first refresh address RA or the second refresh address TA in response to the address selection signal ASS. The first multiplexer 351a may output the second refresh address TA when the address selection signal ASS has a first logic level (e.g., a logic high level), and may output the first refresh address RA when the address selection signal ASS has a second logic level (e.g., a logic low level).

In some example embodiments, the address selection signal ASS, or the first bit CNT[0] of the counting signal may transition from the first logic level to the second logic level or from the second logic level to the first logic level each time the refresh request signal REF_REQ is applied, and the address selecting unit 350a may alternatively output the first refresh address RA and the second refresh address TA to a row decoder in response to the address selection signal ASS that transitions each time the refresh request signal REF_REQ is applied. Accordingly, the counter-based refresh using the first refresh address RA provided from the refresh address counting unit 310a and the table-based refresh using the second refresh address TA provided from the refresh address table 330a may be alternatively performed.

In some example embodiments, the address selecting unit 350a may further include second through fourth multiplexers 353a, 355a and 357a that selectively output a refresh address output from the first multiplexer 351a or a row address A provided from a host device in response to the refresh request signal REF_REQ. The second through fourth multiplexers 353a, 355a and 357a may output the refresh address output from the first multiplexer 351a as an output row address ROW_ADDR when the refresh request signal REF_REQ has the first logic level, and may output the row address A provided from the host device as the output row address ROW_ADDR when the refresh request signal REF_REQ has the second logic level.

In some example embodiments, each of the row addresses A provided from the host device and the output row address ROW_ADDR (i.e., a row address of the volatile memory device) may have L bits, and each of the first and second refresh addresses RA and TA may correspond to lower M bits of the L bits, where L is an integer greater than or equal to M. The second multiplexer 353a may output, as lower M bits ROW_ADDR[M:1] of the output row address ROW_ADDR to be provided to the row decoder, the refresh address output from the first multiplexer 351a or lower M bits A[M:1] of the row address A provided from the host device in response to the refresh request signal REF_REQ. The third multiplexer 355a may output, as upper L−M bits ROW_ADDR[L:M+1] of the output row address ROW_ADDR to be provided to the row decoder, high level signals or upper L−M bits A[L:M+1] of the row address A provided from the host device in response to the refresh request signal REF_REQ, and the fourth multiplexer 357a may output, as inverted upper L−M bits /ROW ADDR[L:M+1] of the output row address ROW ADDR to be provided to the row decoder, high level signals or inverted upper L−M bits/A[L:M+1] of the row address A provided from the host device in response to the refresh request signal REF_REQ. Thus, the address selecting unit 350a may provide the row decoder with the output row address ROW_ADDR indicating one memory cell row corresponding to the row address A provided from the host device when the refresh request signal REF_REQ has the second logic level (e.g., the logic low level), and may provide the row decoder with the output row address ROW_ADDR including the lower M bits ROW_ADDR[M:1] corresponding to the first refresh address RA or the second refresh address TA, the upper L−M bits ROW_ADDR[L:M+1] having the logic high levels and the inverted upper L−M bits/ROW_ADDR[L:M+1] having the logic high levels when the refresh request signal REF_REQ has the first logic level (e.g., the logic high level). Accordingly, one memory cell row corresponding to the row address A provided from the host device may be activated during a normal operation (e.g., a write operation or a read operation), and $2^{(L-M)}$ memory cell rows corresponding to the first refresh address RA or the second refresh address TA may be activated or refreshed at one refresh cycle when the counter-based refresh using the first refresh address RA or the table-based refresh using the second refresh address TA is performed.

As described above, the refresh address generator 300a according to example embodiments may alternately output the first refresh address RA and the second refresh address TA such that the counter-based refresh using the first refresh address RA and the table-based refresh using the second refresh address TA are alternately performed in the volatile memory device including the refresh address generator 300a. Accordingly, the volatile memory device including the refresh address generator 300a according to example embodiments may adaptively perform a refresh operation according to data retention characteristics of respective memory cells while maintaining a refresh time interval (tREFI) defined in a standard of the volatile memory device.

Figure 7:
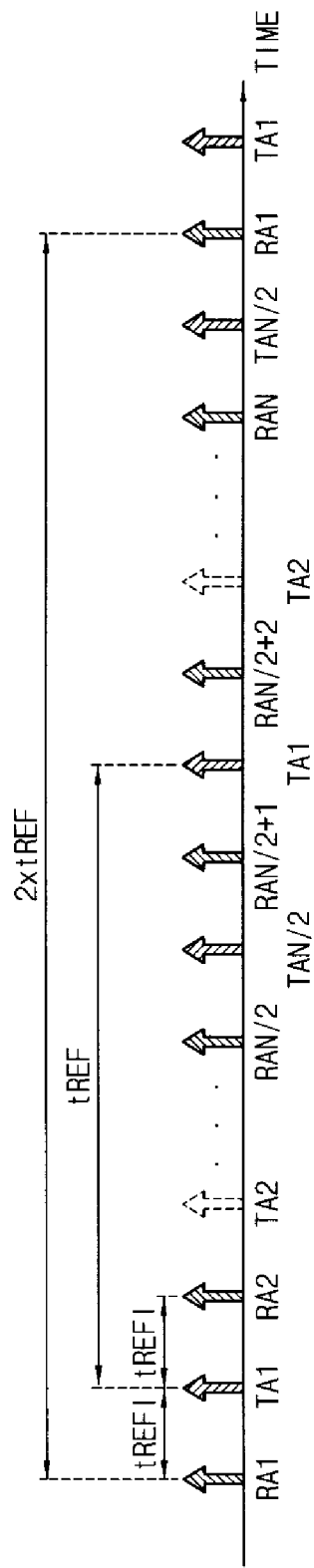
FIG. 7 is a diagram illustrating an exemplary refresh operation performed by a refresh address generator of FIG. 6.

FIG. 7 is a diagram illustrating a refresh operation performed by a refresh address generator of FIG. 6, according to one exemplary embodiment.

Referring to FIGS. 6 and 7, a refresh address counting unit 310a may sequentially output N first refresh addresses RA1, RA2, RAN/2, RAN/2+1, RAN/2+2 and RAN with a period 2*tREF corresponding to double a refresh period tREF defined in a standard of a volatile memory device, and may output an address selection signal ASS that transitions each time a refresh request signal REF_REQ is applied.

A refresh address table 330a may output, as a second refresh address TA, a row address of a memory cell having a retention time shorter than a predetermined time in response to at least some bits of the first refresh address RA. The refresh address table 330a may have N/2 lines, and may output N/2 second refresh addresses TA1, TA2 and TAN/2 with the refresh period tREF defined in the standard of the volatile memory device.

The address selecting unit 350a may alternately output the first refresh address RA provided from the refresh address counting unit 310a and the second refresh address TA provided from the refresh address table 330a in response to the address selection signal ASS that transitions each time the refresh request signal REF_REQ is applied. Accordingly, the volatile memory device including the refresh address generator 300a may alternately perform a counter-based refresh using the first refresh address RA and a table-based refresh using the second refresh address TA each time the refresh request signal REF_REQ is applied. Accordingly, the volatile memory device including the refresh address generator 300a according to example embodiments may adaptively perform a refresh operation according to data retention characteristics of respective memory cells while maintaining a refresh time interval (tREFI) defined in the standard of the volatile memory device.

In some example embodiments, the refresh address table 330a may include a master data field 335a that stores master data MD representing whether the second refresh address TA is stored in each line of the refresh address table 330a. In a case where the master data MD stored in the master data field 335a of a line corresponding to the at least some bits of the first refresh address RA indicate that the second refresh address TA is not stored in the line, the table-based refresh using the second refresh address TA may be skipped. For example, as illustrated in FIG. 7, in a case where the master data MD stored in the master data field 335a of a second line of the refresh address table 330a indicate that the second refresh address TA2 is not stored in the second line, the table-based refresh for the second refresh address TA2 may be skipped when the at least some bits of the first refresh address RA indicate the second line and the address selection signal ASS indicates that the second refresh address TA2 is to be output. Accordingly, since the table-based refresh is skipped, power consumption of the volatile memory device may be reduced.

Figure 8:
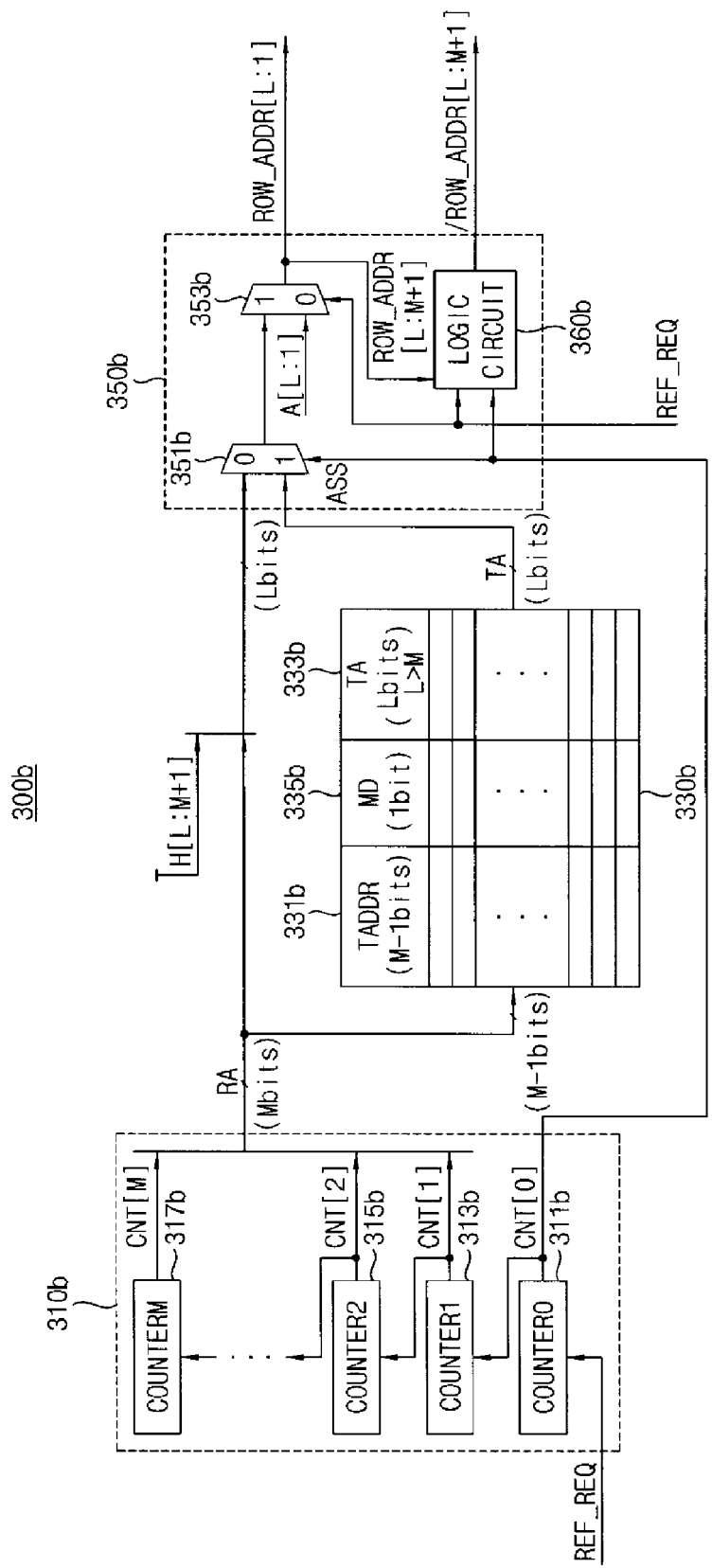
FIG. 8 is a block diagram illustrating a refresh address generator according to example embodiments.
Figure 9:
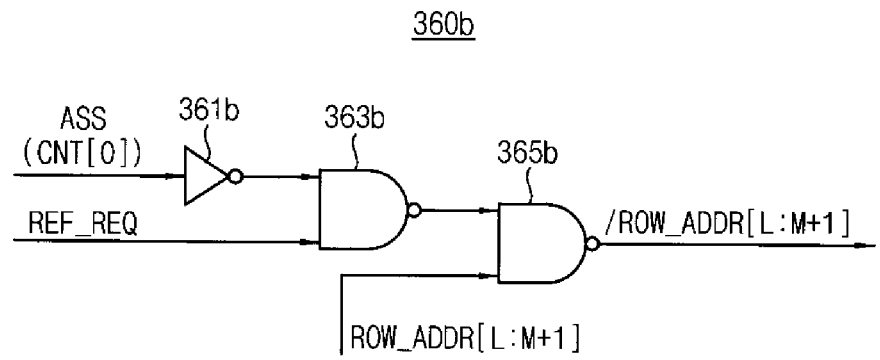
FIG. 9 is a circuit diagram illustrating an exemplary logic circuit included in a refresh address generator of FIG. 8.

FIG. 8 is a block diagram illustrating a refresh address generator according to example embodiments, and FIG. 9 is a circuit diagram illustrating a logic circuit included in a refresh address generator of FIG. 8.

Referring to FIG. 8, a refresh address generator 300b includes a refresh address counting unit 310b, a refresh address table 330b and an address selecting unit 350b. Unlike a refresh address table 330a of FIG. 6 storing a second refresh address TA having lower M bits among L bits of a row address, the refresh address table 330b of FIG. 8 may store the second refresh address TA having L bits, where L is an integer greater than or equal to M.

The refresh address counting unit 310b may generate a counting signal CNT[0], CNT[1], CNT[2] and CNT[M] by performing a counting operation in response to a refresh request signal REF_REQ, may output at least one bit CNT[0] of the counting signal CNT[0], CNT[1], CNT[2] and CNT[M] as an address selection signal ASS, and may output other bits CNT[1], CNT[2] and CNT[M] of the counting signal CNT[0], CNT[1], CNT[2] and CNT[M] as a first refresh address RA. For example, the refresh address counting unit 310b may include first through M+1-th counters 311b, 313b, 315b and 317b that are connected in series. The address selection signal ASS output from the first counter 311b may transition from a first logic level to a second logic level or from the second logic level to the first logic level each time the refresh request signal REF_REQ is applied. The first refresh address RA output from the second through M+1-th bits CNT[1], CNT[2] and CNT[M] may have a period corresponding to double a period corresponding to double a refresh period (tREF) defined in a standard of a volatile memory device.

The refresh address table 330b may store a row address of a memory cell having a retention time shorter than a predetermined time, and may output, as a second refresh address TA, the row address stored in a line corresponding to at least some bits (e.g., low M−1 bits) of the first refresh address RA. The refresh address table 330b may include a table address field 331b representing an address (i.e., a table address TADDR) of each line of the refresh address table 330b, and a refresh address field 333b in which the second refresh address TA is stored. The refresh address table 330b may output the second refresh address TA stored in the refresh address field 333b in a line of which the table address field 331b stores the table address TADDR the same as the at least some bits (e.g., lower M−1 bits) of the first refresh address RA. The refresh address table 330b may further include a master data field 335b representing whether the second refresh address TA is stored in each line of the refresh address table 330b.

The address selecting unit 350b may include a first multiplexer 351b that selectively outputs the first refresh address RA provided from the refresh address counting unit 310b or the second refresh address TA provided from the refresh address table 330b in response to the address selection signal ASS. The address selecting unit 350b may alternatively output the first refresh address RA and the second refresh address TA in response to the address selection signal ASS that transitions each time the refresh request signal REF_REQ is applied, and thus a counted-based refresh using the first refresh address RA provided from the refresh address counting unit 310b and a table-based refresh using the second refresh address TA provided from the refresh address table 330b may be alternatively performed. The first multiplexer 351b may receive the second refresh address TA having L bits at a first input terminal, and may receive the first refresh address RA as lower M bits and high level signals H[L:M−1] as upper L−M bits at a second input terminal.

The address selecting unit 350b may further include a second multiplexer 353b that selectively outputs a refresh address output from the first multiplexer 351b or a row address A output from a host device in response to the refresh request signal REF_REQ.

In some example embodiments, each of a row address ROW ADDR of the volatile memory device and the row address A provided from the host device may have L bits, the first refresh address RA provided from the refresh address counting unit 310b may correspond to lower M bits among the L bits, and the second refresh address TA provided from the refresh address table 330b may correspond to the L bits. When the refresh request signal REF_REQ has a second logic level (e.g., a logic low level), the address selecting unit 350b may output the row address A[L:1] provided from the host device as the row address ROW_ADDR[L:1] to be provided to a row decoder. Accordingly, during a normal operation (e.g., a write operation or a read operation), one memory cell row corresponding to the row address A provided from the host device may be activated.

When the refresh request signal REF_REQ has a first logic level (e.g., a logic high level), and the address selection signal ASS has the second logic level (e.g., a logic low level), the address selecting unit 350b may output the row address ROW ADDR including lower M bits ROW_ADDR[M:1] corresponding to the first refresh address RA, upper L−M bits ROW_ADDR[L:M+1] having logic high levels and inverted upper L−M bits /ROW_ADDR[L:M+1] having logic high levels. Accordingly, the volatile memory device may activate 2^(L−M) memory cell rows corresponding to the first refresh address RA, and may perform counter-based refreshes for the 2^(L−M) memory cell rows at one refresh cycle. In some example embodiments, the address selecting unit 350b may further include a logic circuit 360b for generating the inverted upper L−M bits/ROW_ADDR[L:M+1] when the address selecting unit 350b outputs the first refresh address RA and the high level signals H[L:M+1].

For example, referring to FIG. 9, the logic circuit 360b may include an inverter 361b, a first NAND gate 363b and a second NAND gate 365b. The inverter 361b may invert the address selection signal ASS, or a least significant bit CNT[0] of the counting signal CNT[0], CNT[1], CNT[2] and CNT[M]. The first NAND gate 363b may perform a NAND operation on an output signal of the inverter 361b and the refresh request signal REF_REQ. The second NAND gate 365b may perform a NAND operation on an output signal of the first NAND gate 363b and upper L−M bits ROW_ADDR[L:M+1] of the row address ROW_ADDR. When the counter-based refresh is performed, the address selection signal ASS may have a logic low level, and the refresh request signal REF_REQ may have a logic high level. In this case, the inverter 361b may output the output signal having a logic high level, and the first NAND gate 363b may output the output signal having a logic low level in response to the output signal of the inverter 361b having the logic high level and the refresh request signal having the logic high level. The second NAND gate 365b may output the inverted upper L−M bits/ROW_ADDR[L:M+1] having logic high levels in response to the output signal of the first NAND gate 363b having the logic low level and the upper L−M bits ROW_ADDR[L:M+1] having the logic high levels. When a normal operation is performed or when the table-based refresh is performed, the first NAND gate 363b may output the output signal having the logic low level, and thus the second NAND gate 365b may output the inverted upper L−M bits/ROW_ADDR[L:M+1] having values opposite to those of the upper L−M bits ROW_ ADDR[L:M+1].

When the refresh request signal has the first logic level (e.g., a logic high level), and the address selection signal ASS has the first logic level (e.g., a logic high level), the address selecting unit 350b may output the row address ROW_ADDR [L:1] corresponding to the second refresh address TA. Accordingly, the volatile memory device may activate one memory cell row corresponding to the second refresh address TA in at least one memory bank, and may perform the table-based refresh for the one memory cell row at one refresh cycle.

As described above, the refresh address generator 300b according to example embodiments may alternately output the first refresh address RA and the second refresh address TA such that the counter-based refresh using the first refresh address RA and the table-based refresh using the second refresh address TA are alternately performed in the volatile memory device including the refresh address generator 300b. Accordingly, the volatile memory device including the refresh address generator 300b according to example embodiments may adaptively perform a refresh operation according to data retention characteristics of respective memory cells while maintaining a refresh time interval (tREFI) defined in a standard of the volatile memory device. Further, the refresh address generator 300b according to example embodiments may store the second refresh address TA corresponding to all bits (e.g., the L bits) of the row address ROW_ADDR, and thus the table-based refresh for one memory cell row per memory bank may be performed at each refresh cycle. Accordingly, power consumption of the volatile memory device including the refresh address generator 300b may be reduced.

According to the above explanations, in one embodiment, a refresh method includes refreshing memory cells of a first set of rows of a memory array (e.g., rows that include all cells having a retention time above 2tREF) at a first refresh rate having a first refresh period (e.g., 2tREF). The method further includes refreshing memory cells of a second set of rows of the array (e.g., rows that include at least one cell having a retention time between tREF and 2tREF) at a second refresh rate having a second refresh period (e.g., tREF). In this example, tREF may represent a refresh period defined in a standard for a nonvolatile memory device that includes the memory array. As also described above, the first set of rows can be refreshed using a counter-based refresh, and the second set of rows can be refreshed using a table-based refresh.

In one embodiment, as a result of this process, first and second sub-operations are performed. The first sub-operation may be a counter-based refresh, and the second sub-operation may be a table-based refresh. The first sub-operation is performed by cycling through all of the rows of the memory array consecutively at equally spaced first time intervals (e.g., 2tREFI) based on a counter, such that each row of the first refresh sub-operation is refreshed subsequent to an adjacent previously refreshed row of the first refresh sub-operation after an occurrence of the first time interval. The time between two refreshes of the same row in the first refresh sub-operation may be referred to as a refresh cycle.

The second refresh sub-operation is performed within the refresh cycle on a plurality of rows of the memory array (e.g., rows with at least one cell having a retention time less than 2tREF, referred to in this example as "first rows") based on information stored in the refresh address table (330a or 330b). The second sub-operation is not performed within the refresh cycle on a plurality of other rows of the memory array (e.g., rows with all cells having a retention time greater than 2tREF, referred to in this example as "second rows").

The combined first and second sub-operations maybe performed in an interleaved manner, such that the overall refresh rate for the memory array stays the same as the standard (e.g., tREF), but the refresh rate for individual rows within the memory array varies. Some rows may have a refresh rate greater than tREF, and others may have a refresh rate less than tREF.

Figure 10A:
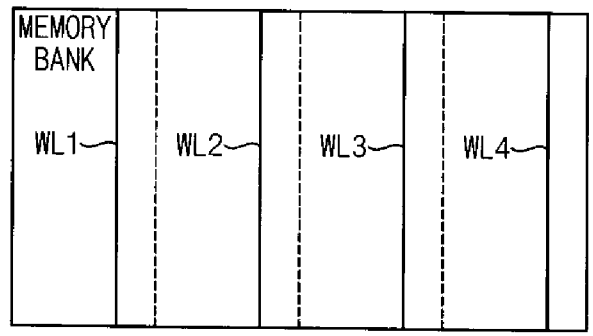
FIG. 10A is a diagram illustrating an example of a counter-based refresh performed by a refresh address generator of FIG. 8.
Figure 10B:
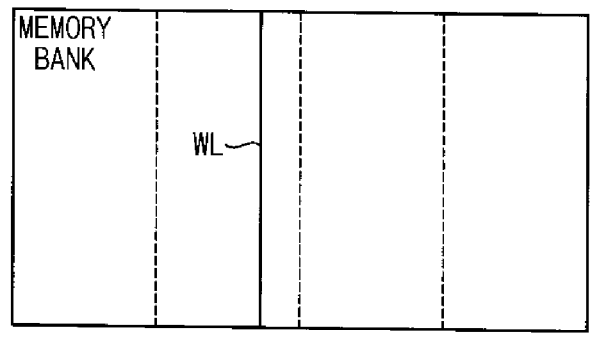
FIG. 10B is an example of a table-based refresh performed by a refresh address generator of FIG. 8.

FIG. 10A is a diagram illustrating an example of a counter-based refresh performed by a refresh address generator of FIG. 8, and FIG. 10B is an example of a table-based refresh performed by a refresh address generator of FIG. 8.

Referring to FIGS. 8 and 10A, a refresh address counting unit 310b may output a first refresh address RA having M bits, and an address selecting unit 350b may output a row address ROW_ADDR including lower M bits ROW_ADDR[M:1] corresponding to the first refresh address RA, upper L–M bits ROW_ADDR[L:M+1] having logic high levels and inverted upper L-M bits/ROW_ADDR[L:M+1] having logic high levels. Accordingly, at each memory bank, $2^{(L-M)}$ word lines WL1, WL2, WL3 and WL4 having lower M bits ROW_ADDR[M:1] corresponding to the first refresh address RA may be activated, and counter-based refreshes for $2^{(L-M)}$ memory cell rows coupled to the $2^{(L-M)}$ word lines WL1, WL2, WL3 and WL4 may be performed at one refresh cycle.

Referring to FIGS. 8 and 10B, a refresh address table 330b may store a second refresh address TA having L bits corresponding to all bits of the row address ROW_ADDR. At each memory bank, one word line WL corresponding to the second refresh address TA may be activated, and a table-based refresh for one memory cell row coupled to the word line WL may be performed at one refresh cycle. Accordingly, since the table-based refresh for one memory cell row is performed at one refresh cycle, power consumption of a volatile memory device may be reduced.

Figure 11:
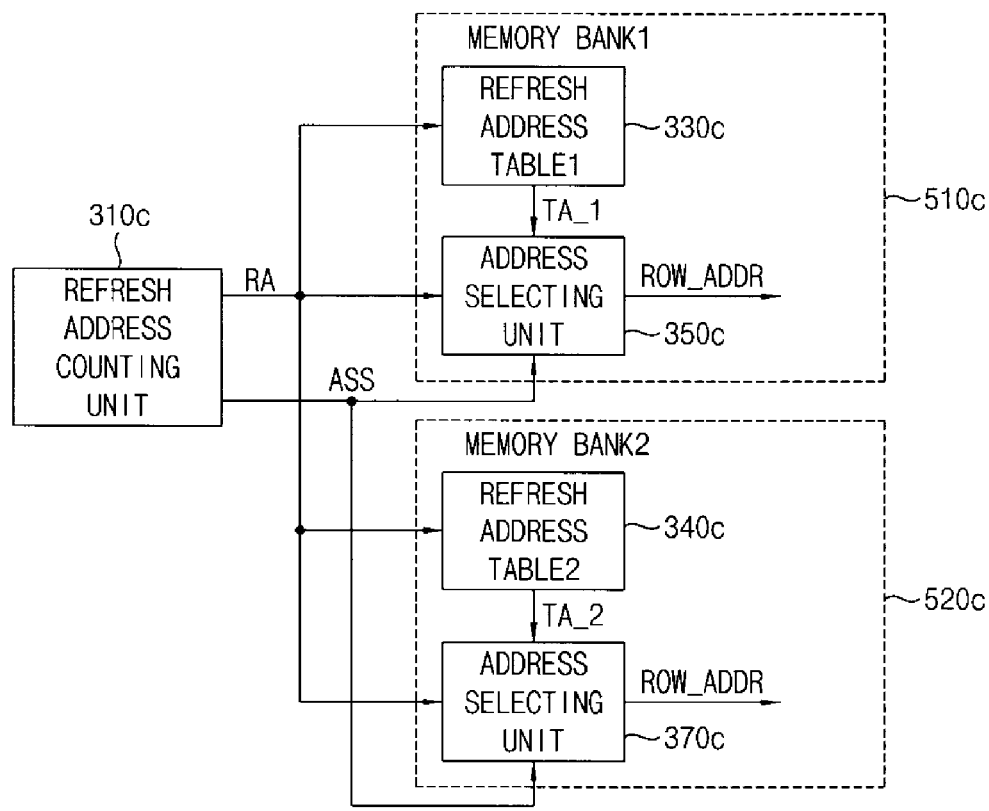
FIG. 11 is a block diagram illustrating a refresh address generator according to example embodiments.
Figure 12:
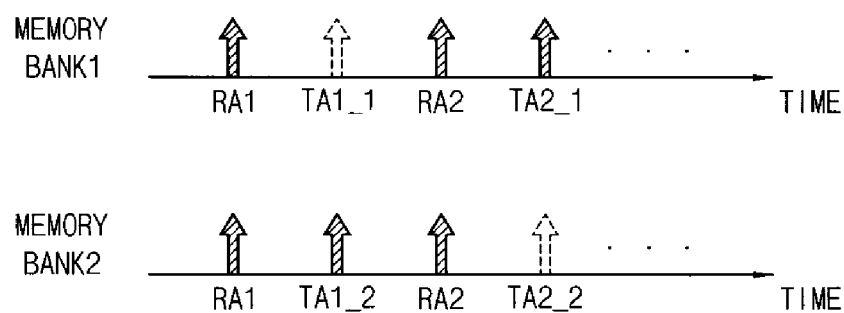
FIG. 12 is a diagram illustrating an exemplary refresh operation performed by a refresh address generator of FIG. 11.

FIG. 11 is a block diagram illustrating a refresh address generator according to example embodiments, and FIG. 12 is a diagram illustrating an exemplary refresh operation performed by a refresh address generator of FIG. 11.

Referring to FIG. 11, a refresh address generator 300c includes a refresh address counting unit 310c, a plurality of refresh address tables 330c and 340c, and a plurality of address selecting units 350c and 370c. The refresh address generator 300c may include at least one refresh address table 330c and 340c and/or at least one address selecting unit 350c and 370c per memory bank 510c and 520c.

The refresh address counting unit 310c may generate a counting signal by performing a counting operation in response to a refresh request signal, may output at least one bit of the counting signal as an address selection signal ASS, and may output other bits of the counting signal as a first refresh address RA.

At least one refresh address table 330c and 340c may be provided per memory bank 510c and 520c. For example, a first memory bank 510c may include a first refresh address table 330c, and a second memory bank 520c may include a second refresh address table 340c. The first refresh address table 330c may store a row address of a memory cell having a retention time shorter than a predetermined time among memory cells in the first memory bank 510c, and the second refresh address table 340c may store a row address of a memory cell having a retention time shorter than the predetermined time among memory cells in the second memory bank 520c. The first refresh address table 330c may output a second refresh address TA_1 for a memory cell row of the first memory bank 510c in response to at least some bits of the first refresh address RA, and the second refresh address table 340c may output a second refresh address TA_2 for a memory cell row of the second memory bank 520c in response to the at least some bits of the first refresh address RA.

At least one address selecting unit 350c and 370c may be provided per memory bank 510c and 520c. For example, the first memory bank 510c may include a first address selecting unit 350c, and the second memory bank 520c may include a second address selecting unit 370c. The first address selecting unit 350c may selectively output the first refresh address RA provided from the refresh address counting unit 310c or the second refresh address TA_1 provided from the first refresh address table 330c in response to the address selection signal ASS, and the second address selecting unit 370c may selectively output the first refresh address RA provided from the refresh address counting unit 310c or the second refresh address TA_2 provided from the second refresh address table 340c in response to the address selection signal ASS.

As described above, since each memory bank 510c and 520c includes the corresponding refresh address table 330c and 340c, the respective memory banks 510c and 520c may perform table-based refreshes for memory cell rows having different row addresses. Accordingly, at each memory bank 510c and 520c, only the memory cell row having the retention time shorter than the predetermined time may be refreshed. Further, since each memory bank 510c and 520c includes the corresponding refresh address table 330c and 340c, the table-based refresh may be skipped at a portion or all of memory banks 510c and 520c according to values of master data fields of respective lines in the respective refresh address tables 330c and 340c.

For example, as illustrated in FIG. 12, when the first refresh address RA provided from the refresh address counting unit 310c indicates first lines of the refresh address tables 330c and 340c, and the address selection signal ASS indicates that the table-based refresh is to be performed, master data of the first line of the first refresh address table 330c may indicate that the second refresh address TA1_1 is not stored in the first line of the first refresh address table 330c, and master data of the first line of the second refresh address table 340c may indicate that the second refresh address TA1_2 is stored in the first line of the second refresh address table 340c. In this case, the table-based refresh using the second refresh address TA1_2 may be performed at the second memory bank 520c, and the table-based refresh using the second refresh address TA1_1 may be skipped at the first memory bank 510c. Further, when the first refresh address RA indicates second lines of the refresh address tables 330c and 340c, and the address selection signal ASS indicates that the table-based refresh is to be performed, master data of the second line of the first refresh address table 330c may indicate that the second refresh address TA2_1 is stored in the second line of the first refresh address table 330c, and master data of the second line of the second refresh address table 340c may indicate that the second refresh address TA2_2 is not stored in the second line of the second refresh address table 340c. In this case, the table-based refresh using the second refresh address TA2_1 may be performed at the first memory bank 510c, and the table-based refresh using the second refresh address TA2_2 may be skipped at the second memory bank 520c.

As described above, the refresh address generator 300c according to example embodiments may alternately output the first refresh address RA and the second refresh address TA_1 and TA_2 such that the counter-based refresh using the first refresh address RA and the table-based refresh using the second refresh address TA_1 and TA_2 are alternately performed in the volatile memory device including the refresh address generator 300c. Accordingly, the volatile memory device including the refresh address generator 300c according to example embodiments may adaptively perform a refresh operation according to data retention characteristics of respective memory cells while maintaining a refresh time interval (tREFI) defined in a standard of the volatile memory device. Further, the refresh address generator 300c according to example embodiments may include the plurality of refresh address tables 330c and 340c respectively corresponding to the plurality of memory banks 510c and 520c. Accordingly, the table-based refreshes for memory cell rows having different row addresses may be performed at the respective memory banks 510c and 520c, and the table-based refresh may be skipped at least a portion of memory banks 510c and 520c, thereby reducing the power consumption.

Figure 13:
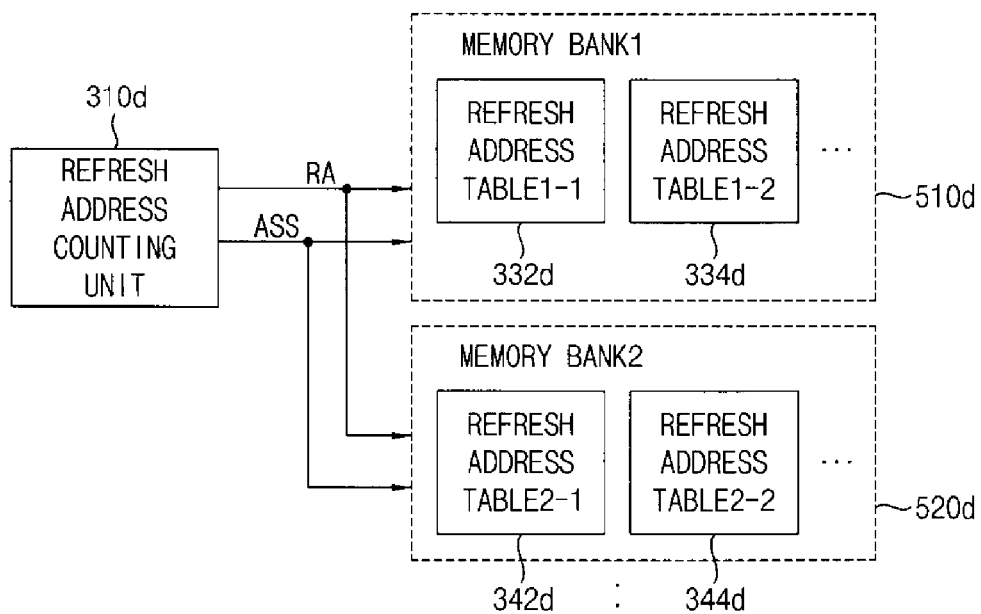
FIG. 13 is a block diagram illustrating a refresh address generator according to example embodiments.

FIG. 13 is a block diagram illustrating a refresh address generator according to example embodiments.

Referring to FIG. 13, a refresh address generator 300d includes a refresh address counting unit 310d, a plurality of refresh address tables 332d, 334d, 342d and 344d, and a plurality of address selecting units. The refresh address generator 300d may include a plurality of refresh address tables 332d, 334d, 342d and 344d and/or a plurality of address selecting units per memory bank 510d and 520d.

The refresh address counting unit 310d may generate a counting signal by performing a counting operation in response to a refresh request signal, may output at least one bit of the counting signal as an address selection signal ASS, and may output other bits of the counting signal as a first refresh address RA.

At least one refresh address table 332d, 334d, 342d and 344d may be provided per sub-array of each memory bank 510d and 520d. For example, a first sub-array of a first memory bank 510d may include a first refresh address table 332d, and a second sub-array of the first memory bank 510d may include a second refresh address table 334d. Further, a first sub-array of a second memory bank 520d may include a third refresh address table 342d, and a second sub-array of the second memory bank 520d may include a fourth refresh address table 344d. Accordingly, each sub-array may perform a table-based refresh using the corresponding refresh address table 332d, 334d, 342d and 344d, and thus only a memory cell row having a retention time shorter than a predetermined time may be refreshed at each sub-array. Further, the table-based refresh may be skipped at a portion or all of the sub-arrays of each memory bank 510d and 520d, thereby reducing power consumption.

Figure 14:
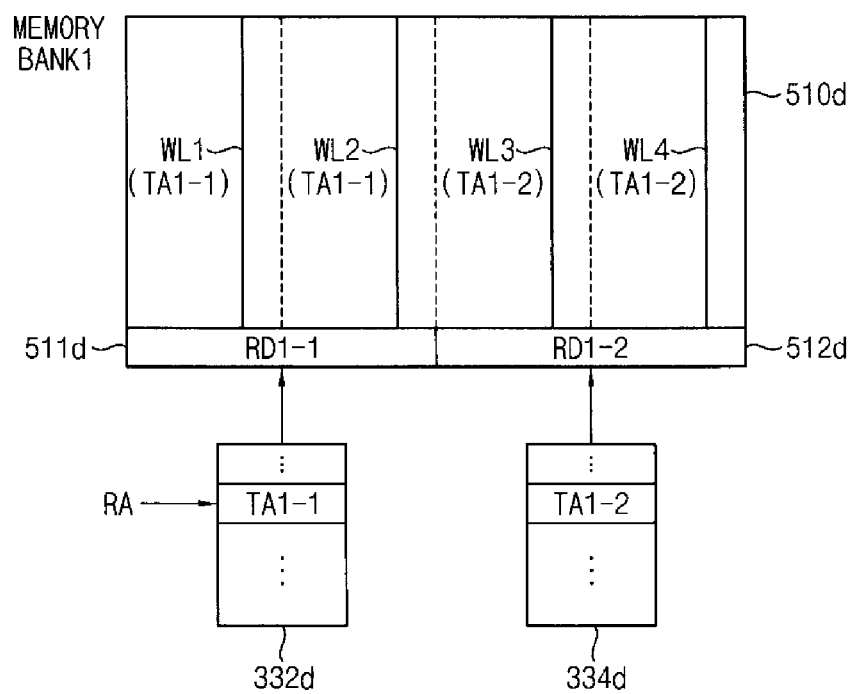
FIG. 14 is a diagram illustrating an example of a refresh operation performed by a refresh address generator of FIG. 13.

FIG. 14 is a diagram illustrating an example of a refresh operation performed by a refresh address generator of FIG. 13.

Referring to FIG. 14, each memory bank 510d may be divided into a first sub-array coupled to a first row decoder (RD1-1) 511d, and a second sub-array coupled to a second row decoder (RD1-2) 512d. The first sub-array may include a first refresh address table 332d, and the second sub-array may include a second refresh address table 334d. The first sub-array may activate at least one word line WL1 and WL2 indicated by a second refresh address TA1-1 stored in the first refresh address table 332d, and may perform a table-based refresh for at least one memory cell row coupled to the at least one word line WL1 and WL2. Further, the second sub-array may activate at least one word line WL3 and WL4 indicated by a second refresh address TA1-2 stored in the second refresh address table 334d, and may perform a table-based refresh for at least one memory cell row coupled to the at least one word line WL3 and WL4. As described above, each sub-array may perform the table-based refresh using the corresponding refresh address table 332d and 334d, and thus only a memory cell row having a retention time shorter than a predetermined time may be refreshed at each sub-array.

Figure 15:
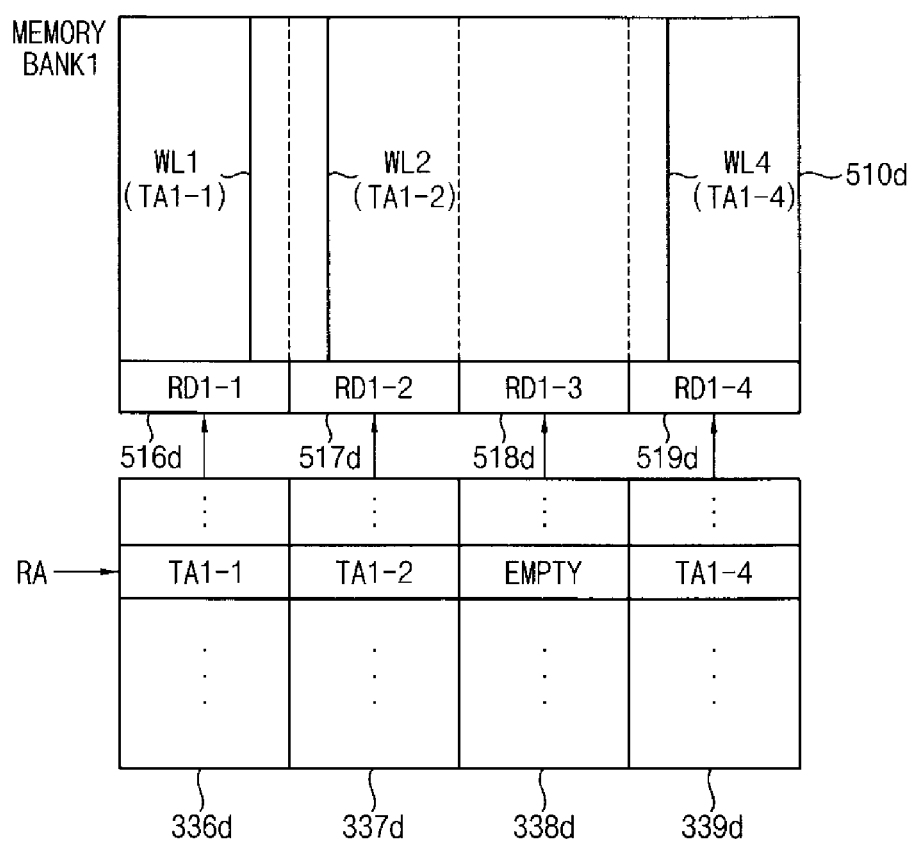
FIG. 15 is a diagram illustrating another example of a refresh operation performed by a refresh address generator of FIG. 13.

FIG. 15 is a diagram illustrating another example of a refresh operation performed by a refresh address generator of FIG. 13.

Referring to FIG. 15, each memory bank 510d may be divided into a first sub-array coupled to a first row decoder (RD1-1) 516d, a second sub-array coupled to a second row decoder (RD1-2) 517d, a third sub-array coupled to a third row decoder (RD1-3) 518d, and a fourth sub-array coupled to a fourth row decoder (RD1-4) 519d. The first sub-array may include a first refresh address table 336d, the second sub-array may include a second refresh address table 337d, the third sub-array may include a third refresh address table 338d, and the fourth sub-array may include a fourth refresh address table 339d. The first sub-array may activate a word line WL1 indicated by a second refresh address TA1-1 stored in the first refresh address table 336d, and may perform a table-based refresh for a memory cell row coupled to the word line WL1. The second sub-array may activate a word line WL2 indicated by a second refresh address TA1-2 stored in the second refresh address table 337d, and may perform a table-based refresh for a memory cell row coupled to the word line WL2. In a case where master data stored in a line of the third refresh address table 338d corresponding to a first refresh address RA indicate that the second refresh address is not stored in the line of the third refresh address table 338d, the third sub-array may skip a table-based refresh. The fourth sub-array may activate a word line WL4 indicated by a second refresh address TA1-4 stored in the fourth refresh address table 339d, and may perform a table-based refresh for a memory cell row coupled to the word line WL4. As described above, each sub-array may perform the table-based refresh using the corresponding refresh address table 336d, 337d, 338d and 339d, and thus only a memory cell row having a retention time shorter than a predetermined time may be refreshed at each sub-array. Further, the table-based refresh may be skipped at a portion or all of the sub-arrays of each memory bank 510d, thereby reducing power consumption.

Figure 16:
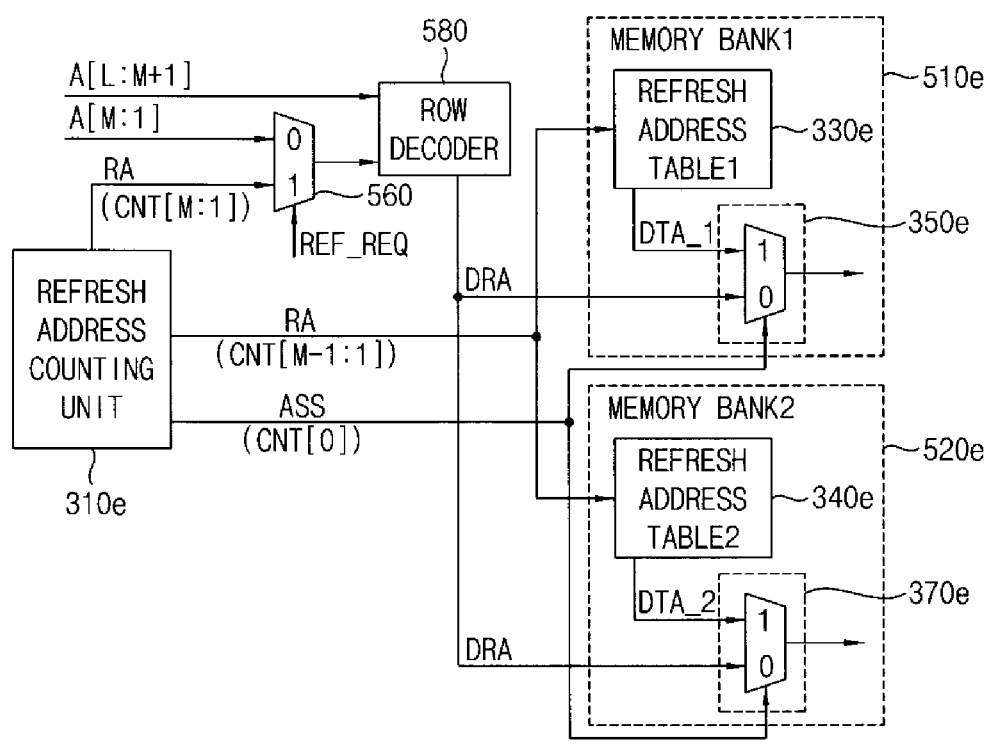
FIG. 16 is a block diagram illustrating a refresh address generator according to example embodiments.

FIG. 16 is a block diagram illustrating a refresh address generator according to example embodiments.

Referring to FIG. 16, a refresh address generator 300e includes a refresh address counting unit 310e, at least one refresh address table 330e and 340e, and at least one address selecting unit 350e and 370e. The at least one refresh address table 330e and 340e may store decoded second refresh address DTA_1 and DTA_2.

The refresh address counting unit 310e may generate a counting signal by performing a counting operation in response to a refresh request signal, may output at least one bit of the counting signal as an address selection signal ASS, and may output other bits of the counting signal as a first refresh address RA.

The first refresh address RA output from the refresh address counting unit 310e may be provided to a row address multiplexer 560. The row address multiplexer 560 may selectively output the first refresh address RA or a row address A provided from a host device in response to a refresh request signal REF_REQ. The first refresh address RA or the row address A output from the row address multiplexer 560 may be provided to a row decoder 580. The row decoder 580 may decode the first refresh address RA or the row address A to output a decoded row address DRA. In some example embodiments, a row address of a volatile memory device may have L bits, and the first refresh address may have M bits smaller than the L bits. In this case, when the row decoder 580 receives the first refresh address RA, the row decoder 580 may decode the lower M bits among the entire L bits of a row address.

One refresh address table 330e and 340e may be provided in the volatile memory device, or at least one refresh address table 330e and 340e may be provided per memory bank 510e and 520e. For example, a first memory bank 510e may include a first refresh address table 330e, and a second memory bank 520e may include a second refresh address table 340e. The first refresh address table 330e may store a decoded row address of a memory cell row of the first memory bank 510e, and the second refresh address table 340e may store a decoded row address of a memory cell row of the second memory bank 520e. The first refresh address table 330e may output the decoded second refresh address DTA_1 for the memory cell row of the first memory bank 510e in response to at least some bits of the first refresh address RA, and the second refresh address table 340e may output the decoded second refresh address DTA_2 for the memory cell row of the second memory bank 520e in response to the at least some bits of the first refresh address RA.

One address selecting unit 350e and 370e may be provided in the volatile memory device, or at least one address selecting unit 350e and 370e may be provided per memory bank 510e and 520e. For example, the first memory bank 510e may include a first address selecting unit 350e, and the second memory bank 520e may include a second address selecting unit 370e. The first address selecting unit 350e may selectively output the decoded row address DRA output from the row decoder 580 or the decoded second refresh address DTA_1 provided from the first refresh address table 330e in response to the address selection signal ASS, and the second address selecting unit 370e may selectively output the decoded row address DRA output from the row decoder 580 or the decoded second refresh address DTA_2 provided from the second refresh address table 340e in response to the address selection signal ASS.

As described above, since the at least one refresh address table 330e and 340e stores the decoded second refresh address DTA_1 and DTA_2, additional decoders for decoding the second refresh addresses DTA_1 and DTA_2 output from the refresh address tables 330e and 340e of the respective memory banks 510e and 520e are not needed.

Figure 17:
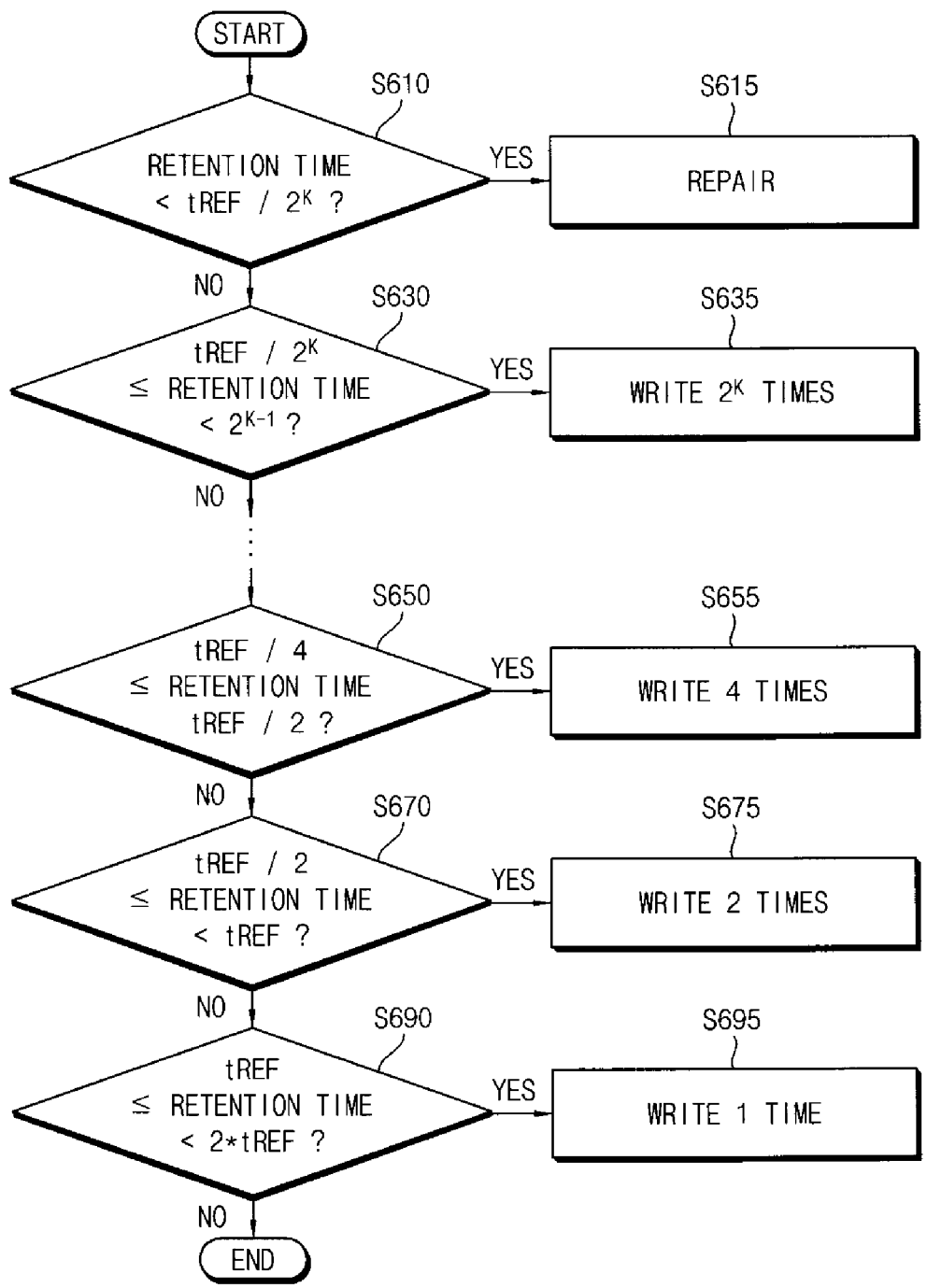
FIG. 17 is a flow chart illustrating a method of testing a volatile memory device according to example embodiments.

FIG. 17 is a flow chart illustrating a method of testing a volatile memory device according to example embodiments.

Referring to FIG. 17, retention times of memory cell rows included in a volatile memory device may be tested. A memory cell row having a retention time shorter than tREF/$2^K$ may be identified, where tREF is a refresh period defined in a standard of the volatile memory device, and K is an integer greater than 0 (S610). If the retention time of the memory cell row is shorter than tREF/$2^K$ (S610: YES), the memory cell row may be repaired, or may be replaced with a redundancy cell row (S615).

A memory cell row having a retention time longer than or equal to tREF/$2^K$ and shorter than tREF/$2^{\hat{0}(K-1)}$ may be identified (S630). If the retention time of the memory cell row is longer than or equal to tREF/$2^K$ and shorter than tREF/$2^{\hat{0}(K-1)}$ (S630: YES), a row address of the memory cell row may be written $2^K$ times in a refresh address table (S635). In one embodiment, the row address of the memory cell row may be stored in evenly spaced lines. For example, the row address of the memory cell row may be stored in $2^K$ lines that are spaced apart from each other by a gap corresponding to an equally divided portion when the refresh address table is divided into $2^K$ equal portions. Accordingly, the table-based refresh for the memory cell row may be performed with a period of tREF/2^K, and thus the memory cell row can retain stored data.

A memory cell row having a retention time longer than or equal to tREF/4 and shorter than tREF/2 may be identified (S650). If the retention time of the memory cell row is longer than or equal to tREF/4 and shorter than tREF/2 (S650: YES), a row address of the memory cell row may be written 4 times in the refresh address table (S655). For example, the row address of the memory cell row may be stored in four lines that are spaced apart from each other by a gap corresponding to a quarter of the refresh address table. Accordingly, the table-based refresh for the memory cell row may be performed with a period of tREF/4, and thus the memory cell row can retain stored data.

A memory cell row having a retention time longer than or equal to tREF/2 and shorter than tREF may be identified (S670). If the retention time of the memory cell row is longer than or equal to tREF/2 and shorter than tREF (S670: YES), a row address of the memory cell row may be written twice in the refresh address table (S675). For example, the row address of the memory cell row may be stored in two lines that are spaced apart from each other by a gap corresponding to a half of the refresh address table. Accordingly, the table-based refresh for the memory cell row may be performed with a period of tREF/2, and thus the memory cell row can retain stored data.

A memory cell row having a retention time longer than or equal to tREF and shorter than 2*tREF may be identified (S690). If the retention time of the memory cell row is longer than or equal to tREF and shorter than 2*tREF (S690: YES), a row address of the memory cell row may be written once in the refresh address table (S695). Accordingly, the table-based refresh for the memory cell row may be performed with a period of tREF, and thus the memory cell row can retain stored data.

A memory cell row having a retention time longer than or equal to 2*tREF may retain stored data even if only a counter based refresh is performed for the memory cell row, and thus a row address of the memory cell row may not be stored in the refresh address table.

As illustrated in FIG. 17, a row address of a memory cell row having a relatively short retention time may be first stored in the refresh address table, which ensures that the row address is written in evenly spaced lines of the refresh address table.

According to example embodiments, the method of testing the volatile memory device may be performed in various levels or stages. For example, the method of testing the volatile memory device may be performed at a wafer level, a package level, a module level, a system level (e.g., during a built-in self test (BIST) of a mobile system), etc.

Although FIG. 17 illustrates an example where the retention times are divided according to whether the retention times are longer than or equal to tREF/2^K and shorter than tREF/2^(K−1), according to example embodiments, the retention times may be divided in various manners. For example, in some example embodiments, the retention times may be divided according to whether the retention times are longer than or equal to tREF/I and shorter than tREF/(I−1), where I is an integer greater than 1. In this case, a row address of a memory cell row having a retention time longer than or equal to tREF/I and shorter than tREF/(I−1) may be stored in I evenly spaced lines of the refresh address table.

Figure 18:
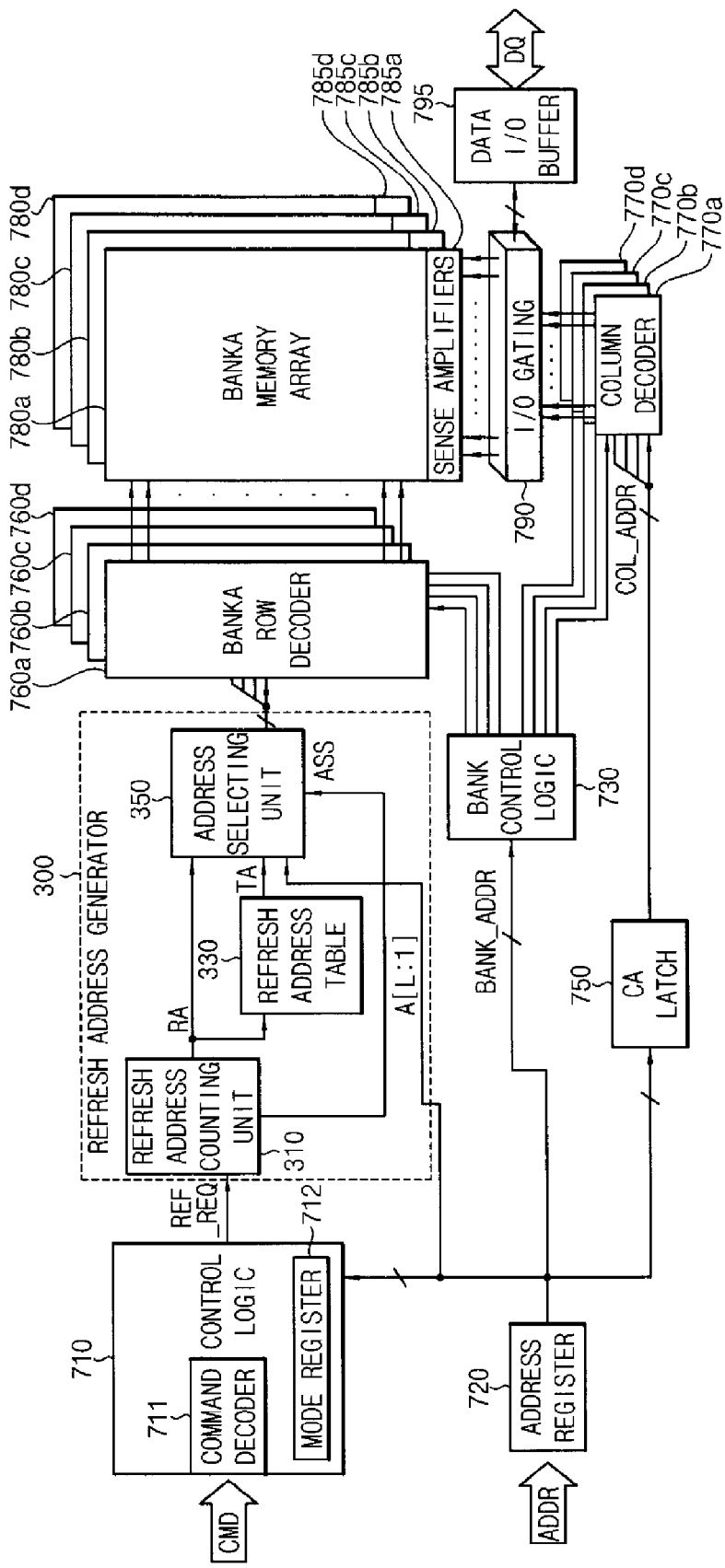
FIG. 18 is a block diagram illustrating a volatile memory device according to example embodiments.

FIG. 18 is a block diagram illustrating a volatile memory device according to example embodiments.

Referring to FIG. 18, a volatile memory device 700 includes a control logic 710, an address register 720, a bank control logic 730, a column address latch 750, a row decoder, a column decoder, a memory cell array, a sense amplifier unit, an input/output gating circuit 790, a data input/output buffer 795 and a refresh address generator 300. The memory cell array may include first through fourth bank arrays 780a, 780b, 780c and 780d. The row decoder may include first through fourth bank row decoders 760a, 760b, 760c and 760d respectively coupled to the first through fourth bank arrays 780a, 780b, 780c and 780d, the column decoder may include first through fourth bank column decoders 770a, 770b, 770c and 770d respectively coupled to the first through fourth bank arrays 780a, 780b, 780c and 780d, and the sense amplifier unit may include first through fourth bank sense amplifiers 785a, 785b, 785c and 785d respectively coupled to the first through fourth bank arrays 780a, 780b, 780c and 780d. The first through fourth bank arrays 780a, 780b, 780c and 780d, the first through fourth bank row decoders 760a, 760b, 760c and 760d, the first through fourth bank column decoders 770a, 770b, 770c and 770d and the first through fourth bank sense amplifiers 785a, 785b, 785c and 785d may form first through fourth memory banks, respectively. Although the volatile memory device 700 is illustrated in FIG. 18 as including four memory banks, the volatile memory device 700 may include any number of memory banks.

According to example embodiments, the volatile memory device 700 may be a dynamic random access memory (DRAM) such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), or other volatile memory devices having a refresh operation. One or more of these devices may operate at a refresh rate that complies with a standard.

In some embodiments, the refresh address generator 300 may generate addresses for a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or for other volatile memory devices that use a refresh operation.

The address register 720 may receive an address ADDR including a bank address BANK_ADDR, a row address A[L:1], and a column address COL_ADDR from a memory controller (or a host device). The address register 720 may transfer the received bank address BANK_ADDR to the bank control logic 730, the received row address A[L:1] to an address selecting unit 350, and the received column address COL_ADDR to the column address latch 750.

The bank control logic 730 may generate bank control signals in response to the bank address BANK_ADDR. One of the bank row decoders 760a, 760b, 760c, and 760d corresponding to the bank address BANK_ADDR may be activated in response to the bank control signals, and one of the bank column decoders 770a, 770b, 770c, and 770d corresponding to the bank address BANK_ADDR may be activated in response to the bank control signals.

The address selecting unit 350 may receive the row address A[L:1] from the address register 720, may receive a first refresh address RA from a refresh address counting unit 310, and may receive a second refresh address TA from a refresh address table 330. The address selecting unit 350 may selectively output the row address A[L:1], the first refresh address RA or the second refresh address TA in response to a refresh request signal REF_REQ and an address selection signal ASS. The row address A[L:1], the first refresh address RA or the second refresh address TA output from the address selecting unit 350 may be provided to the bank row decoders 760a, 760b, 760c, and 760d.

The activated one of the bank row decoders 760a, 760b, 760c, and 760d may decode the row address output from the address selecting unit 350, and may activate a word line corresponding to the row address. In some example embodiments, when a counter-based refresh or a table-based refresh is performed, all of the first through fourth bank row decoders 760a, 760b, 760c, and 760d may decode the first refresh address RA or the second refresh address TA, and thus the counter-based refresh or the table-based refresh may be performed at the respective memory banks.

The column address latch 750 may receive and temporarily store the column address COL_ADDR from the address register 720. In a burst mode according to an example embodiment, the column address latch 750 may generate column addresses incremented from the received column address COL_ADDR. The column address latch 750 may apply such a column address to the bank column decoders 770a, 770b, 770c, and 770d.

An activated one of the bank column decoders 770a, 770b, 770c, and 770d may decode the column address COL_ADDR from the column address latch 750 for controlling the input/output gating circuit 790 to output data corresponding to the column address COL_ADDR.

The input/output gating circuit 790 may include circuitry for gating input/output data, an input data mask logic, read data latches for storing data from the bank arrays 780a, 780b, 780c, and 780d, and write drivers for writing data to the bank arrays 780a, 780b, 780c, and 780d.

Data DQ to be read from one of the bank arrays 780a, 780b, 780c, and 780d may be sensed by a respective sense amplifier coupled to that bank array and may be stored in the read data latches, and such data DQ may be provided to the memory controller via the data input/output buffer 795. Data DQ to be written to one of the bank arrays 780a, 780b, 780c, and 780d may be provided from the memory controller to the data input/output buffer 795, and such data DQ may be written to that bank array via the write drivers.

The control logic 710 may control operations of the volatile memory device 700 by generating control signals to perform a read or write operation. The control logic 710 may include a command decoder 711 that decodes a command CMD received from the memory controller and a mode register 712 that sets an operation mode of the volatile memory device 700. For example, the command decoder 711 may generate the control signals corresponding to the command CMD by decoding a write enable signal (/WE), a row address strobe signal (/RAS), a column address strobe signal (/CAS), and a chip select signal (/CS). The command decoder 711 may further receive a clock signal (CLK) and a clock enable signal (/CKE) for operating the volatile memory device 700 in a synchronous manner. The control logic 710 may control the refresh address generator 300 to perform an auto refresh operation in response to a refresh command (REF) or to perform a self refresh operation in response to a self refresh entry command (SRE), in an example embodiment of the present invention.

The refresh address generator 300 may include the refresh address counting unit 310 that performs a counting operation in response to the refresh request signal REF_REQ, and the refresh address table 330 that stores a row address of a memory cell having a retention time shorter than a predetermined time. The refresh address generator 300 may alternately output the first refresh address RA and the second refresh address TA such that the counter-based refresh using the first refresh address RA provided from the refresh address counting unit 310 and the table-based refresh using the second refresh address TA provided from the refresh address table 330 are alternately performed.

Accordingly, the volatile memory device 700 according to example embodiments may perform the table-based refresh for a memory cell row having a short retention time without increasing refresh current or power consumption while maintaining the refresh standard.

Figure 19:
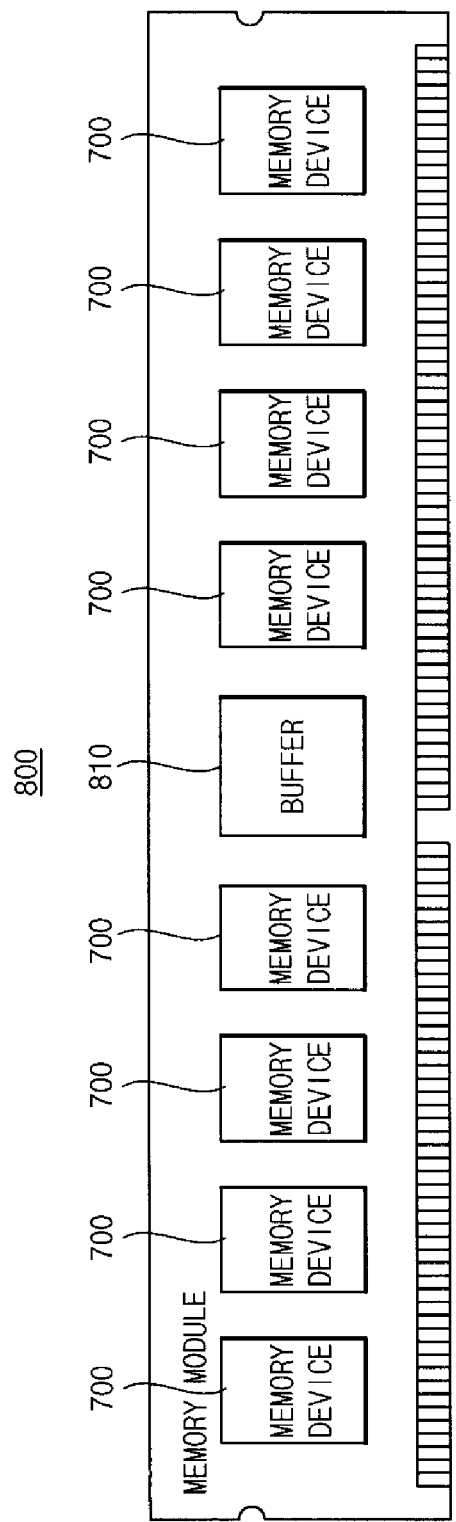
FIG. 19 is a diagram illustrating a memory module including a volatile memory device according to example embodiments.

FIG. 19 is a diagram illustrating a memory module including a volatile memory device according to example embodiments.

Referring to FIG. 19, a memory module 800 includes a plurality of volatile memory devices 700. For example, the memory module 800 may be an unbuffered dual in-line memory module (UDIMM), a registered dual in-line memory module (RDIMM), a fully buffered dual in-line memory module (FBDIMM), a load reduced dual in-line memory module LRDIMM, or the like.

The memory module 800 may further include a buffer 810 that provides a command/address signal and data by buffering the command/address signal and the data from a memory controller through a plurality of transmission lines.

In some example embodiments, data transmission lines between the buffer 810 and the volatile memory devices 700 may be coupled in a point-to-point topology, and command/address transmission lines between the buffer 810 and the volatile memory devices 700 may be coupled in a multi-drop topology, a daisy-chain topology, a fly-by daisy-chain topology, or the like. The buffer 810 may buffer both the command/address signal and the data, and thus the memory controller may interface with the memory module 800 by driving only a load of the buffer 810. Accordingly, the memory module 800 may include more volatile memory devices and/or more memory ranks, and a memory system may include more memory modules.

The volatile memory devices 700 may alternately perform a counter-based refresh and a table-based refresh, and thus may adaptively perform a refresh operation according to data retention characteristics of respective memory cells without increasing a refresh current or refresh power consumption since a refresh time interval (tREFI) defined in a standard of the volatile memory device is maintained.

Figure 20:
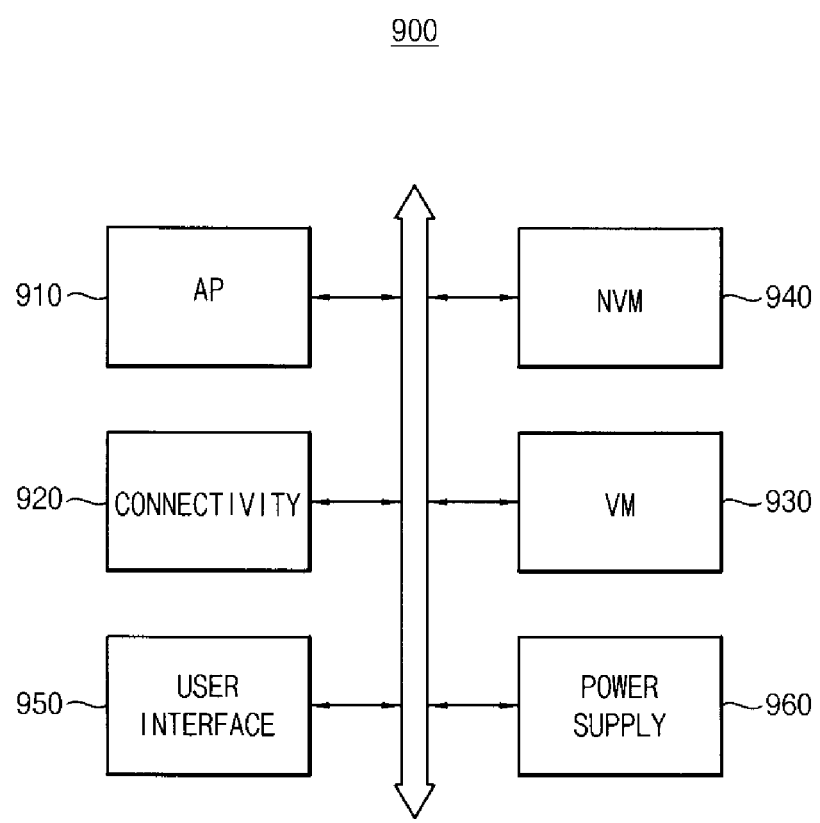
FIG. 20 is a block diagram illustrating a mobile system including a volatile memory device according to example embodiments.

FIG. 20 is a block diagram illustrating a mobile system including a volatile memory device according to example embodiments.

Referring to FIG. 20, a mobile system 900 may include an application processor 910, a connectivity unit 920, a volatile memory device 930, a nonvolatile memory device 940, a user interface 950, and a power supply 960. For example, the mobile system 900 may be a mobile phone, a smart phone, a personal digital assistant (PDA), a portable multimedia player (PMP), a digital camera, a music player, a portable game console, a navigation system, or the like.

The application processor 910 may execute applications such as a web browser, a game application, or a video player. For example, the application processor 910 may include a single core or multiple cores such as when the application processor 1410 is a dual-core processor, a quad-core processor, or a hexa-core processor. In addition, the application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, or universal serial bus (USB) communication. For example, the connectivity unit 920 may include a baseband chipset that supports communications, such as global system for mobile communications (GSM), general packet radio service (GPRS), wideband code division multiple access (WCDMA), or high speed downlink/uplink packet access (HSxPA).

The volatile memory device 930 may store data processed by the application processor 910 or operates as a working memory. For example, the volatile memory device 930 may be a dynamic random access memory, such as DDR SDRAM, LPDDR SDRAM, GDDR SDRAM, or RDRAM. The volatile memory device 930 may alternately perform a counter-based refresh and a table-based refresh, and thus may adaptively perform a refresh operation according to data retention characteristics of respective memory cells without increasing a refresh current or refresh power consumption since a refresh time interval (tREFI) defined in a standard of the volatile memory device is maintained.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM).

The user interface 950 may include at least one input device such as a keypad or a touch screen and at least one output device such as a speaker or a display device. The power supply 960 may supply a power supply voltage to the mobile system 900. The mobile system 900 may further include a camera image processor (CIS) and/or a storage device such as a memory card, a solid state drive (SSD), a hard disk drive (HDD), or a CD-ROM.

The mobile system 900 and/or components of the mobile system 900 may be packaged on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 21:
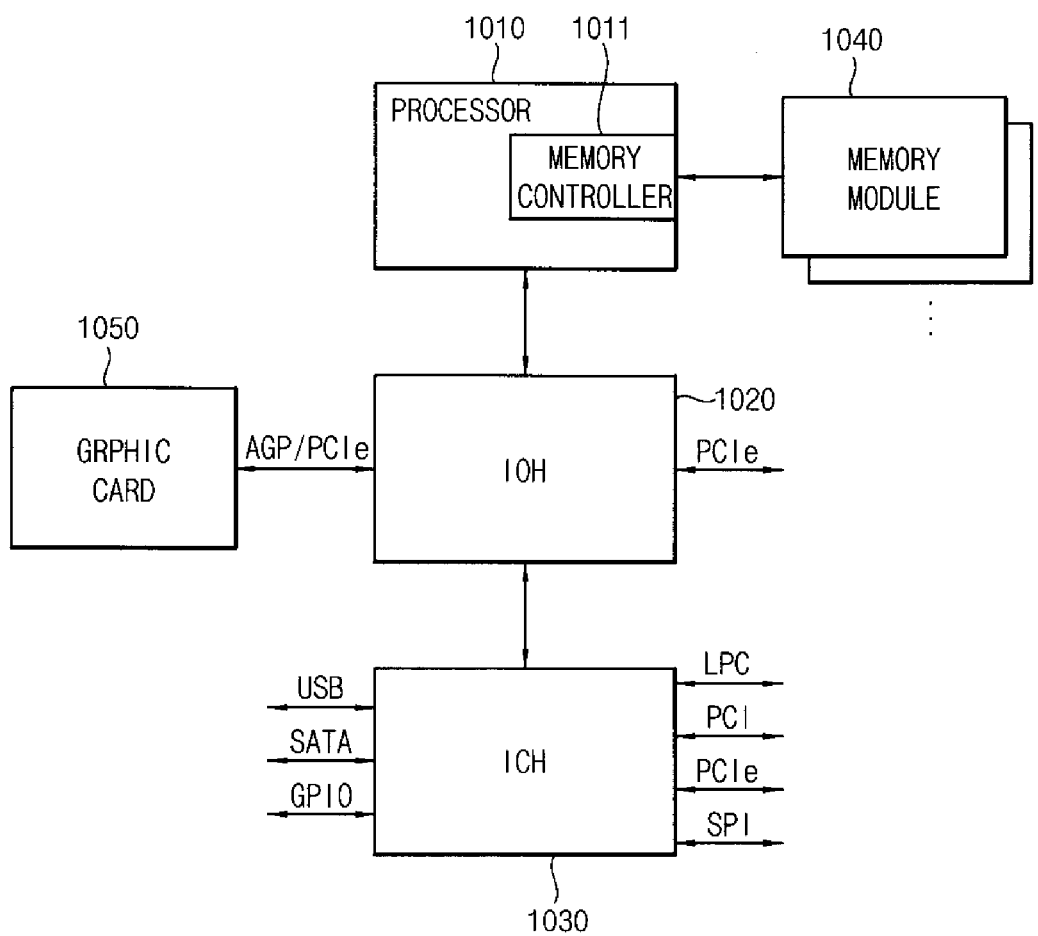
FIG. 21 is a block diagram illustrating a computing system including a volatile memory device according to example embodiments.

FIG. 21 is a block diagram illustrating a computing system including a volatile memory device according to example embodiments.

Referring to FIG. 21, a computing system 1000 may include a processor 1010, an input/output hub (IOH) 1020, an input/output controller hub (ICH) 1030, at least one memory module 1040, and a graphics card 1050. For example, the computing system 1000 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, or a navigation system.

The processor 1010 may perform various computing functions such execution of specific software for performing specific calculations or tasks. For example, the processor 1010 may be a microprocessor, a central process unit (CPU), a digital signal processor, or the like that includes a single core or multiple cores such as a dual-core processor, a quad-core processor, or a hexa-core processor. FIG. 21 illustrates the computing system 1000 including one processor 1010, but the computing system 1000 may include a plurality of processors. The processor 1010 may include an internal or external cache memory.

The processor 1010 includes a memory controller 1011 for controlling operations of the memory module 1040. The memory controller 1011 included in the processor 1010 may be referred to as an integrated memory controller (IMC). A memory interface between the memory controller 1011 and the memory module 1040 may be implemented with a single channel including a plurality of signal lines, or may be implemented with multiple channels to each of which at least one memory module 1040 may be coupled. In some example embodiments, the memory controller 1011 may be located inside the input/output hub 1020 which may be referred to as a memory controller hub (MCH).

The memory module 1040 may include a plurality of volatile memory devices that store data provided from the memory controller 1011. The volatile memory devices may perform an auto refresh operation in response to a refresh command (REF) from the memory controller 1011, and/or performs a self refresh operation in response to a self refresh entry command (SRE) from the memory controller 1011. When performing the auto refresh operation or the self refresh operation, the volatile memory devices may alternately perform a counter-based refresh and a table-based refresh, and thus may adaptively perform the refresh operation according to data retention characteristics of respective memory cells without increasing a refresh current or refresh power consumption since a refresh time interval (tREFI) defined in a standard of the volatile memory device is maintained.

The input/output hub 1020 may manage data transfer between the processor 1010 and devices such as the graphics card 1050. The input/output hub 1020 may be coupled to the processor 1010 via various interfaces. For example, the interface between the processor 1010 and the input/output hub 1020 may be a front side bus (FSB), a system bus, a Hyper-Transport, a lightning data transport (LDT), a QuickPath interconnect (QPI), or a common system interface (CSI). The input/output hub 1020 may provide various interfaces with the devices, such as an accelerated graphics port (AGP) interface, a peripheral component interface-express (PCIe), or a communications streaming architecture (CSA) interface.

The graphics card 1050 may be coupled to the input/output hub 1020 via AGP or PCIe for controlling a display device (not shown) to display an image. The graphics card 1050 may include an internal processor for processing image data and an internal memory device. For example, the input/output hub 1020 may include an internal graphics device along with or instead of the graphics card 1050 outside the input/output hub 1020. The graphics device included in the input/output hub 1020 may be referred to as integrated graphics. Furthermore, the input/output hub 1020 including the internal memory controller and the internal graphics device may be referred to as a graphics and memory controller hub (GMCH).

The input/output controller hub 1030 may perform data buffering and interface arbitration to efficiently operate various system interfaces. The input/output controller hub 1030 may be coupled to the input/output hub 1020 via an internal bus, such as a direct media interface (DMI), a hub interface, an enterprise Southbridge interface (ESI), or PCIe. The input/ output controller hub 1030 may interface with peripheral devices. For example, the input/output controller hub 1030 may provide a universal serial bus (USB) port, a serial advanced technology attachment (SATA) port, a general purpose input/output (GPIO), a low pin count (LPC) bus, a serial peripheral interface (SPI), PCI, or PCIe.

The processor 1010, the input/output hub 1020, and the input/output controller hub 1030 may be implemented as separate chipsets or separate integrated circuits. Alternatively, at least two of the processor 1010, the input/output hub 1020, and the input/output controller hub 1030 may be implemented as a single chipset.

Embodiments disclosed herein may be applied to any volatile memory device having a refresh operation and/or to a system having the volatile memory device. The foregoing is illustrative of exemplary embodiments and is not to be construed as limiting thereof. Those skilled in the art would readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A refresh method for a volatile memory device including a plurality of memory cells arranged in an array having a plurality of rows and a plurality of columns, each row corresponding to a respective address, the refresh method comprising:
    refreshing memory cells of a first set of rows of the array at a first refresh rate having a first refresh period, the first refresh rate being a lower rate having a longer refresh period than a second refresh rate having a second refresh period, wherein each memory cell in the first set of rows of the array has a retention time longer than the first refresh period; and
    refreshing memory cells of a second set of rows of the array at a third refresh rate having a third refresh period, the third refresh rate being a higher rate having a shorter refresh period than the second refresh rate having the second refresh period, wherein at least one memory cell of each row of the second set of rows has a retention time longer than the third refresh period and shorter than the first refresh period wherein the first refresh period is two times the length of the second refresh period,
    wherein the second refresh period corresponds to a refresh period defined in a standard for the volatile memory device.

2. The method of claim 1, wherein the third refresh period is one half the length of the second refresh period.

3. The method of claim 1, wherein refreshing the memory cells of the first set of rows is performed using a counter-based refresh; and
    refreshing the memory cells of the second set of rows is performed using a table-based refresh.

4. The method of 3, wherein the counter-based refresh includes generating a refresh address at each increase of a counter value.

5. The method of claim 3, wherein the table-based refresh includes outputting a second refresh address stored in a table.

6. The method of claim 5, wherein the first refresh addresses are not stored in the table.

7. The method of claim 3, wherein the counter-based refresh is interleaved with the table-based refresh.

8. The method of claim 1, further comprising:
    refreshing memory cells of a third set of rows of the array at a fourth refresh rate having a fourth refresh period, the fourth refresh rate being a higher rate having a shorter refresh period than the third refresh rate having the third refresh period, wherein at least one memory cell of each row of the fourth set of rows has a retention time longer than the fourth refresh period and shorter than the third refresh period.

9. The method of claim 1, wherein refresh intervals between refreshing the rows of the array are the same as refresh intervals used in the standard for the volatile memory device.

10. A refresh method for a volatile memory device including a plurality of memory cells arranged in an array having a plurality of rows and a plurality of columns, each row corresponding to a respective address, the refresh method comprising:
    refreshing memory cells of a first set of rows of the array at a first refresh rate having a first refresh period, based on a counter-based refresh, wherein the memory cells of the first set of rows have a retention time longer than the first refresh period; and
    refreshing memory cells of a second set of rows of the array at a second refresh rate having a second refresh period, based on a table-based refresh, the second refresh rate being a higher rate having a shorter refresh period than the first refresh period, wherein at least one memory cell of each row of the second set of rows has a retention time longer than the second refresh period and shorter than the first refresh period,
    wherein the counter-based refresh includes generating a first refresh address at each increase of a counter value.

11. The refresh method of claim 10, wherein the first refresh period is longer than a refresh period defined in a standard for the volatile device.

12. The refresh method of claim 10, further comprising refreshing memory cells of a third set of rows of the array at a third refresh rate having a third refresh period, based on a table-based refresh, the third refresh rate being a higher rate having a shorter refresh period than the second refresh rate having the second refresh period, wherein at least one memory cell of each row of the third set of rows has a retention time longer than the third refresh period and shorter than the second refresh period.

13. The method of claim 10, wherein the table-based refresh includes outputting a refresh address stored in a table.

14. A refresh method for a volatile memory device including a plurality of memory cells arranged in an array having a plurality of rows and a plurality of columns, each row corresponding to a respective address, the refresh method comprising:
    refreshing memory cells of a first set of rows of the array at a first refresh rate having a first refresh period, based on a counter-based refresh, wherein the memory cells of the first set of rows have a retention time longer than the first refresh period; and
    refreshing memory cells of a second set of rows of the array at a second refresh rate having a second refresh period, based on a table-based refresh, the second refresh rate being a higher rate having a shorter refresh period than the first refresh period, wherein at least one memory cell of each row of the second set of rows has a retention time longer than the second refresh period and shorter than the first refresh period,
    wherein refreshing the memory cells of the first set of rows of the memory array is interleaved with refreshing the memory cells of the second set of rows of the memory array.

15. A method of performing a refresh operation in a memory device including a memory array having rows and columns, comprising:

performing a first refresh sub-operation by cycling through all of the rows of the memory array consecutively at equally spaced first time intervals based on a counter, such that each row of the first refresh sub-operation is refreshed subsequent to an adjacent previously refreshed row of the first refresh sub-operation after an occurrence of the first time interval, wherein the time between two refreshes of the same row in the first refresh sub-operation is referred to as a refresh cycle; and performing a second refresh sub-operation within the refresh cycle on a plurality of first rows of the memory array based on information stored in a table, and not performing the second refresh sub-operation within the refresh cycle on a plurality of second rows of the memory array, wherein the plurality of first rows each include at least one cell that has a first retention time, and wherein the plurality of second rows include a plurality of cells that have retention times longer than the first retention time.

16. The method of claim 15, wherein the first refresh sub-operation is interleaved with the second refresh sub-operation.

17. The method of claim 15, wherein the first refresh sub-operation is performed using time intervals greater than an industry standard for the memory device.

18. The method of claim 17, wherein the second sub-operation includes refreshing certain rows of the memory array at time intervals less than the industry standard for the memory device.

* * * * *